United States Patent
Hisaoka et al.

(10) Patent No.: US 7,612,865 B2
(45) Date of Patent: Nov. 3, 2009

(54) PATTERN WRITING APPARATUS AND PATTERN WRITING METHOD

(75) Inventors: Katsuyuki Hisaoka, Kyoto (JP); Hiroyuki Shirota, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 235 days.

(21) Appl. No.: 11/896,357

(22) Filed: Aug. 31, 2007

(65) Prior Publication Data

US 2008/0062398 A1 Mar. 13, 2008

(30) Foreign Application Priority Data

Sep. 13, 2006 (JP) ............... P2006-247619

(51) Int. Cl.
  G03B 27/54 (2006.01)
  G03B 27/32 (2006.01)
  B41J 2/47 (2006.01)
  B41J 15/14 (2006.01)
  G03F 1/00 (2006.01)

(52) U.S. Cl. ............... 355/67; 355/77; 347/239; 347/241; 430/322

(58) Field of Classification Search ............... 355/18, 355/53, 67, 71, 77; 347/239, 241, 243, 262; 430/322
See application file for complete search history.

(56) References Cited

U.S. PATENT DOCUMENTS 6,552,777 B2   4/2003  Sunagawa
6,903,798 B2 * 6/2005  Shirota et al. ............... 355/18
7,190,435 B2 * 3/2007  Shirota ............... 355/67
7,268,856 B2 * 9/2007  Shirota et al. ............... 355/67
2003/0214644 A1 * 11/2003  Shirota et al. ............... 355/67
2004/0201832 A1   10/2004  Shirota
2005/0002002 A1   1/2005  Shirota et al.
2006/0269217 A1   11/2006  Shirota et al.

FOREIGN PATENT DOCUMENTS

JP   2001-255664   9/2001
JP   2003-332221   11/2003
JP   2004-326076   11/2004
JP   2005-243870   9/2005
JP   2005-353927   12/2005
JP   2006-339183   12/2006

\* cited by examiner

*Primary Examiner*—Alan A Mathews
(74) *Attorney, Agent, or Firm*—McDermott Will & Emery LLP

(57) ABSTRACT

Light irradiation is performed on a strip region on a photosensitive material by main scanning of an irradiation region group on the photosensitive material where light emitted from a micromirror group of a DMD is directed and light is applied to a plurality of strip regions partially overlapping in a sub scan direction in turn while repeating the main scanning, to write a pattern on the photosensitive material. When a preceding irradiation region group and a following irradiation region group pass over an overlapping area, a part of micromirrors corresponding to the overlapping area, out of the micromirror group, are made inactivated. As a result, a cumulative passage time in which the preceding irradiation region group and the following irradiation region group pass each position of the overlapping area is shorter than a passage time where the preceding irradiation region group passes each position of a non-overlapping area.

22 Claims, 21 Drawing Sheets

PATTERN WRITING APPARATUS AND PATTERN WRITING METHOD

BACKGROUND OF THE INVENTION

1. Field of the Invention

The present invention relates to a pattern writing apparatus and a pattern writing method for writing a pattern on a photosensitive material irradiated with a spatially modulated light.

2. Description of the Background Art

Conventionally known is a technique for writing a fine pattern on a photosensitive material by moving a spatially modulated light on the photosensitive material. A DMD (Digital Micromirror Device) with a micromirror group is proposed to be used as a spatial light modulator.

For example, Japanese Patent Application Laid-Open No. 2004-326076 (Document 1) discloses a technique where an array of an irradiation region group on a photosensitive material to which light from a micromirror group of a DMD is applied, is tilted relatively to a main scan direction and main scanning of the irradiation region group is performed to improve a resolution. In the apparatus of Document 1, the irradiation region group intermittently moves in the sub scan direction every time when main scanning of the irradiation region group is performed. In a case where the irradiation region group is tilted, the number of irradiation regions passing both sides (in the sub scan direction) of a strip region which is irradiated with light in one main scanning is smaller than that of the irradiation regions passing the central portion of the strip region. Therefore, a region written in a preceding main scanning and that written in the following main scanning are partially overlapped to apply full light onto the whole writing region in the apparatus of Document 1.

Japanese Patent Application Laid-Open No. 2005-243870 (Document 2) discloses a pattern writing apparatus for applying light to two scanned bands which are away from each other at one time by moving light emitted from two DMDs, instead of the apparatus where the region group irradiated with light is tilted. In the apparatus, since the order of light irradiation on all scanned bands is devised, it is possible to prevent exposures of both scanned bands on a part of borders between the scanned bands from having a long interval and prevent occurrence of a remaining film on a photoresist layer in all the borders.

It is confirmed that a degree of photo reaction by split two irradiations of an amount of light is larger than that by one irradiation of the same amount of light, depending on characteristics of a photosensitive material. In the method disclosed in Document 1, a degree of photo reaction in an overlapping area between a region irradiated with light in the preceding main scanning and that irradiated with light in the following main scanning can be inadmissibly larger than that in other area (i.e., the overlapping area is an area where writing is performed by passing the irradiation region group twice, to which the light from the micromirror group of the DMD is applied).

SUMMARY OF THE INVENTION

The present invention is intended for a pattern writing apparatus for writing a pattern on a photosensitive material by light irradiation on the photosensitive material. It is an object of the present invention to suppress unevenness appearing in a pattern written in pattern writing in a case where a region which is written by one pass of an irradiation region group and a region which is written by twice passes of the irradiation region group exist on the photosensitive material.

The pattern writing apparatus according to the present invention comprises a light emitting part for emitting light to a photosensitive material; an irradiation region moving mechanism for moving an irradiation region group on the photosensitive material, the irradiation region group irradiated with light emitted from the light emitting part; and a control part for controlling movement of the irradiation region group and light irradiation on respective irradiation regions included in the irradiation region group to perform writing on the photosensitive material by applying light to each position on the photosensitive material while passing a plurality of irradiation regions over the each position, wherein light irradiation is performed on a preceding strip region on the photosensitive material by controlling light irradiation on a preceding irradiation region group by the light emitting part and moving the preceding irradiation region group in parallel with a main scan direction, and light irradiation is performed on a following strip region which is adjacent to and partially overlaps with the preceding strip region by controlling light irradiation on a following irradiation region group by the light emitting part and moving the following irradiation region group in parallel with the main scan direction, and the preceding irradiation region group or the following irradiation region group continuously passes each position of a non-overlapping area which belongs to the preceding strip region or the following strip region in a constant time, and a cumulative passage time in which the preceding irradiation region group and the following irradiation region group pass each position of an overlapping area between the preceding strip region and the following strip region is shorter than the constant time.

According to the present invention, a degree of photo reaction in the overlapping area between the preceding strip region and the following strip region is made equal to that in the non-overlapping area and consequently, it is possible to suppress occurrence of unevenness in a written pattern.

The light emitting part may comprise a spatial light modulator for applying light to the preceding irradiation region group and the following irradiation region group in turn. There may be a case where the light emitting part comprises two spatial light modulators each of which has the same array of a plurality of light modulator elements and a relative position of the two spatial light modulators is fixed, and the two spatial light modulators perform light irradiation on the preceding irradiation region group and the following irradiation region group, respectively.

Preferably, the spatial light modulator has a two-dimensional array of a plurality of light modulator elements arranged in a rectangular region and a plurality of regions on the photosensitive material corresponding to the plurality of light modulator elements are arranged in a row direction and a column direction which are perpendicular to each other in a rectangular form, and the column direction is inclined to the main scan direction. It is thereby possible to improve a resolution of the written pattern. More preferably, since a width in a sub scan direction of the non-overlapping area is equal to a length of projection of a side in the row direction of the rectangular form onto a straight line extending in the sub scan direction, a lot of light modulator elements can be used for writing.

According to a preferred embodiment of the present invention, a part of light modulator elements corresponding to the overlapping area, out of the plurality of light modulator elements in the spatial light modulator, are inactivated in writing of at least one of the preceding strip region and the following strip region, irradiation regions on the photosensitive material corresponding to light modulator elements which are activated in writing of the preceding strip region and the following strip region, are the preceding irradiation region group and the following irradiation region group, respectively, and a cumulative passage time in which the preceding irradiation region group and the following irradiation region group pass each position of the overlapping area decreases as it gets away from a border between the overlapping area and the non-overlapping area in the vicinity of the border. According to another preferred embodiment of the present invention, the number of elements which are inactivated out of light modulator elements corresponding to the overlapping area is changed in the process of writing of at least one of the preceding strip region and the following strip region. As a result, it is possible to more suppress occurrence of unevenness in the overlapping area.

The present invention is also intended for a pattern writing method of writing a pattern on a photosensitive material by light irradiation on the photosensitive material.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
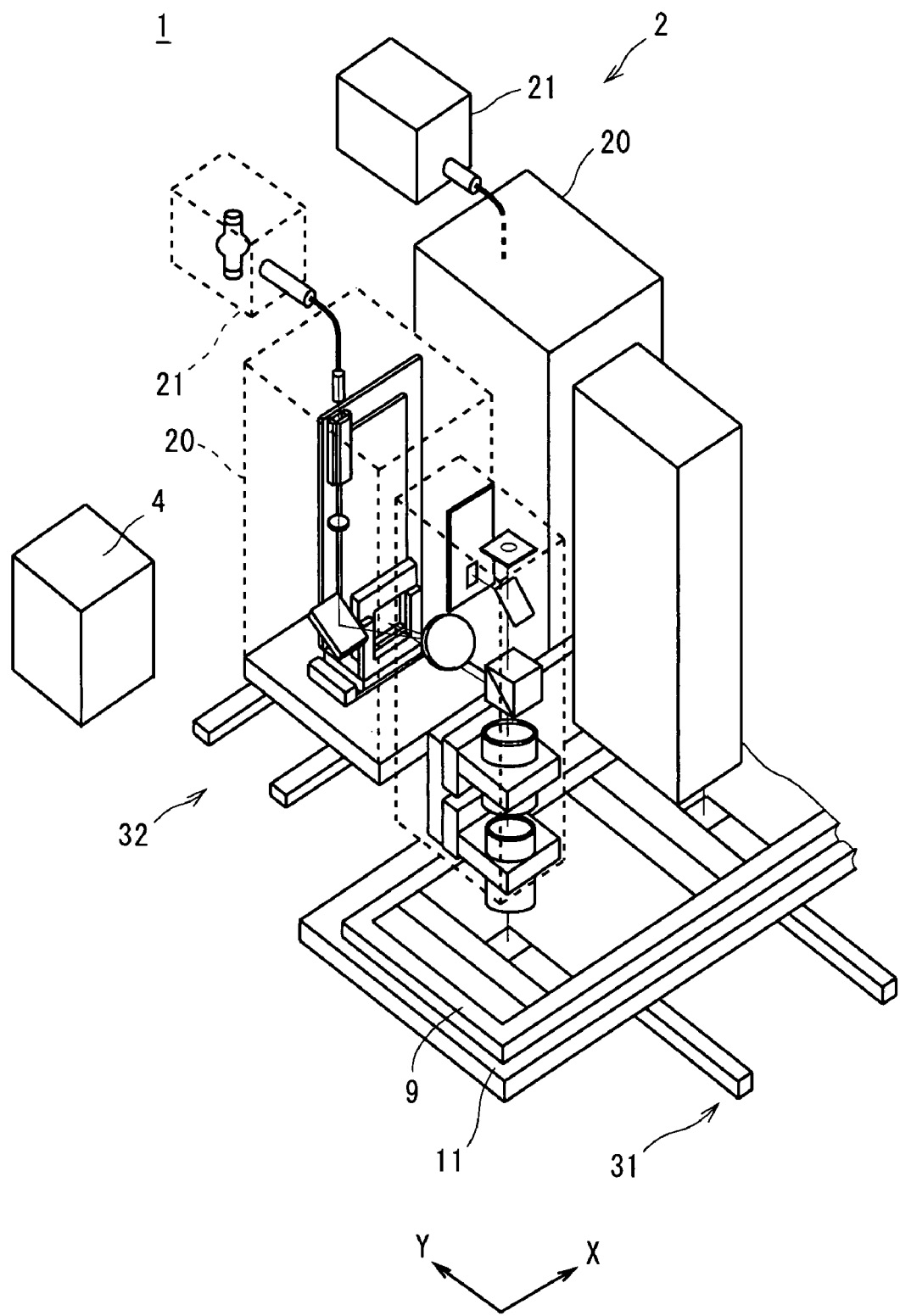
FIG. 1 is a view showing a construction of a pattern writing apparatus.

FIG. 1 is a view showing a construction of a pattern writing apparatus 1 in accordance with the first preferred embodiment of the present invention. The pattern writing apparatus 1 writes a pattern on a photosensitive material by light irradiation on the photosensitive material which is a photoresist film on a substrate 9. The pattern writing apparatus 1 is provided with a light emitting part 2 having two head parts 20 each of which is connected to a light source unit 21. A relative position of the two head parts 20 are fixed each other and the two head parts 20 are moved as a unit in the X direction in FIG. 1 by a head part moving mechanism 32 which is a linear motor. Discussion will be made on the two head parts 20 in FIG. 1 and the following description, but the number of the head part 20 may be three or more.

A stage 11 for holding the substrate 9 and a stage moving mechanism 31 which is a linear motor for moving the stage 11 in the Y direction in FIG. 1 are located below the light emitting part 2. The light emitting part 2, the stage moving mechanism 31, and the head part moving mechanism 32 are connected to a control part 4.

Figure 2:
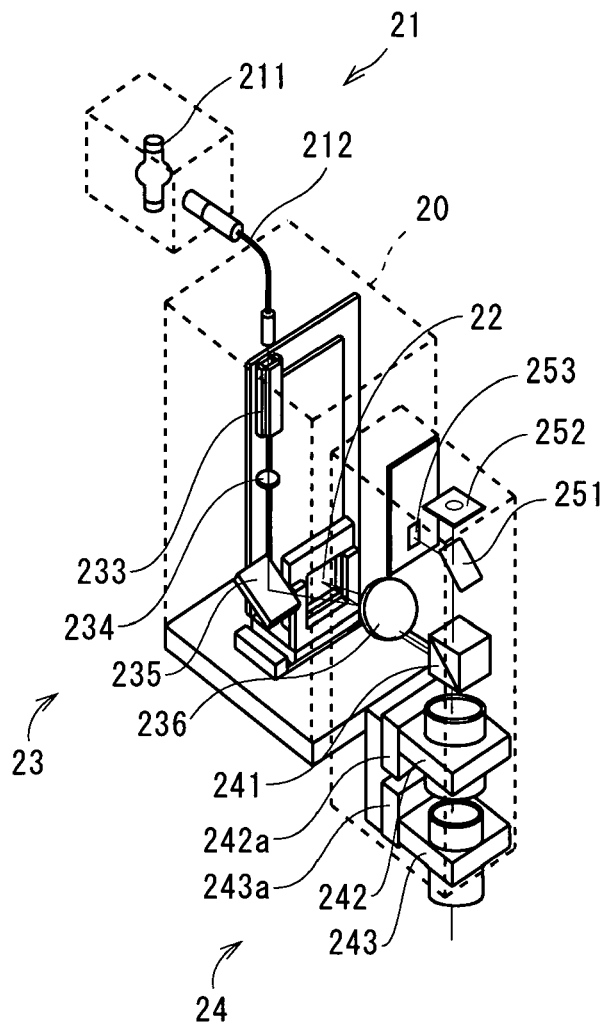
FIG. 2 is a view showing a head part and a light source unit.

FIG. 2 is a view showing an internal construction of one head part 20 and a light source unit 21. The light source unit 21 has a light source 211 for emitting light, such as a mercury lamp, and light from the light source 211 is directed to the head part 20 through optical fibers 212. The head part 20 includes a digital micromirror device (hereinafter, referred to as "DMD") 22 as a spatial light modulator, and light from the optical fibers 212 is reflected by the DMD 22 for generating a two-dimensionally spatially modulated light beam.

Specifically, the light emitted from the optical fibers 212 is directed through a rod integrator 233, a lens 234 and a mirror 235 to a mirror 236, which then focuses and directs light beam onto the DMD 22. The light beam incident on the DMD 22 is uniformly applied to a micromirror group of the DMD 22 at a predetermined angle of incidence.

A bundle of modulated light beams (i.e., spatially modulated light beam) generated from only reflected light from part of all the micromirrors of the DMD 22 which are set in a predetermined position (or orientation) corresponding to an ON state enters and is reflected by a cubic beam splitter 241, and is controlled in magnification by a zoom lens 242, to be directed to a projector lens 243. The zoom lens 242 is controlled by an actuator 242a for zooming such that the magnification is variable. The projector lens 243 is controlled by an actuator 243a for auto-focusing (AF) such that focusing can be achieved.

The light beam from the projector lens 243 is then directed to a region on the substrate 9 which is made optically conjugate to the micromirror group. In the pattern writing apparatus 1, therefore, the rod integrator 233, the lens 234, the mirror 235 and the mirror 236 constitute an illumination optical system 23 for directing the light from the light source unit 21 onto the DMD 22, and the cubic beam splitter 241, the zoom lens 242 and the projector lens 243 constitute a projection optical system 24 for carrying out reduction projection of the light emitted from each of the micromirrors onto the substrate 9.

A half mirror 251, a laser diode (LD) 252 for AF and a sensor 253 for AF sensing are disposed above the cubic beam splitter 241. A light emitted from the LD 252 is transmitted through the half mirror 251 and applied to the substrate 9 through the cubic beam splitter 241, the zoom lens 242 and the projector lens 243. The light from the substrate 9 travels in a reverse direction and is reflected by the half mirror 251, to be sensed by the sensor 253. An output of the sensor 253 is used for control of the actuator 243a for AF.

Figure 3:
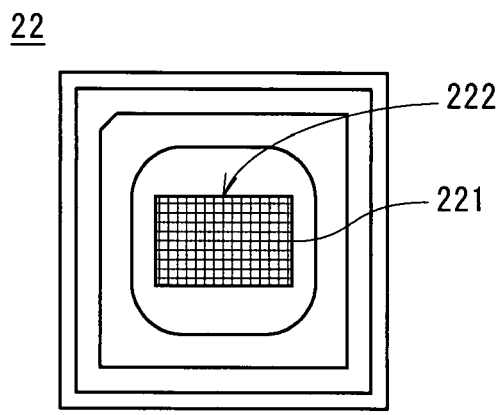
FIG. 3 is a view showing a DMD.

FIG. 3 is a view showing the DMD 22. The DMD 22 is the spatial light modulator where a plurality of micromirrors (hereinafter, generally referred to as "micromirror group 222"), each of which having a side of nearly 14 µm, are two-dimensionally arranged in a rectangular region on a silicon substrate 221 (hereinafter, they are described as an array of M rows and N columns in two directions perpendicular to each other). The position (tilt angle) of each micromirror is individually changeable by the action of the static electric field, according to data written into a memory cell corresponding to the each micromirror (hereinafter, referred to as "writing cell data"). The light is incident upon the DMD 22 at an angle of 24 degrees along a plane which is perpendicular to the DMD 22 and forms an angle of 45 degrees with the column direction of the DMD 22, and the light uniformly illuminates the micromirror group 222. A DMD of a type which includes 768 rows and 1024 columns of micromirrors is employed, and the DMD 22 is divided into 16 blocks each of which is composed of micromirrors in 48 rows and 1024 columns and the 16 blocks can be individually reset.

A reset pulse is applied from the control part 4 shown in FIG. 1 to the DMD 22 on the basis of an encoder signal from the stage moving mechanism 31, every time when the substrate 9 moves relatively to the head parts 20 by a predetermined small distance (a pitch of writing regions which is discussed later). Every time the reset pulse is inputted, each of the micromirrors is tilted in unison in the position of ON state or OFF state about a diagonal line of the surface of the micromirrors according to its corresponding writing cell data. With this operation, the light beam applied to the DMD 22 is reflected in directions of the tilting of the respective micromirrors and light irradiation of the corresponding irradiation regions on the substrate 9 are ON/OFF controlled. That is, when micromirrors whose memory cells are written with data indicating the ON state receive a reset pulse, light incident on those micromirrors is reflected onto the cubic beam splitter 241 and light (small light beams) is applied to corresponding irradiation regions. On the other hand, micromirrors in the OFF reflect incident light to a predetermined position other than that of the cubic beam splitter 241, thus, no light is directed to their corresponding irradiation regions. With the above operation, the plurality of micromirrors function as a plurality of light modulator elements, respectively.

Figure 4:
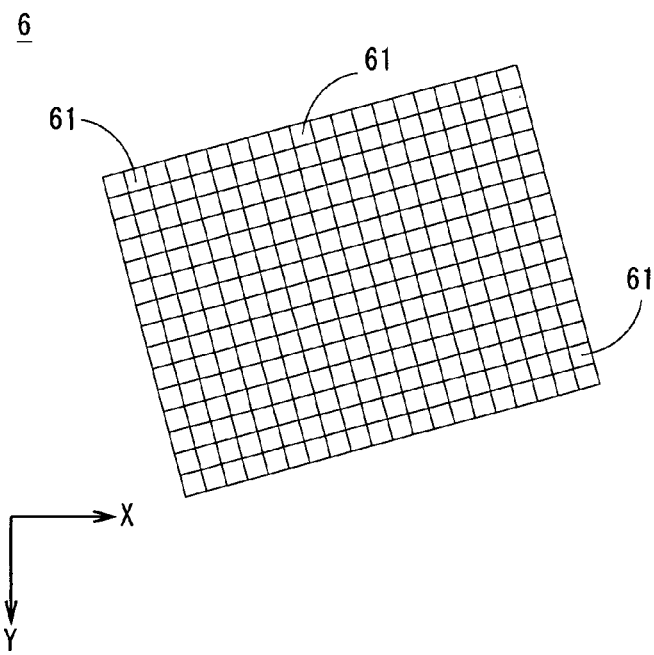
FIG. 4 is a view showing an irradiation region group.

FIG. 4 is a view showing an irradiation region group 6 on the photosensitive material on the substrate 9, the irradiation region group 6 corresponding to the micromirror group 222. In other words, FIG. 4 is a view showing a set of regions which is a unit of light irradiation (accurately, ON/OFF control of light irradiation) performed by the light emitting part 2, where one irradiation region 61 corresponds to one micromirror. The DMD 22 is inclined in the head part 20 and a column direction of the irradiation region group 6 is also inclined to the Y direction which is a main scan direction discussed later. In the following discussion, out of two directions of arrangement of the irradiation region group 6, a direction approximately along the main scan direction (i.e., a direction which forms a smaller angle with the main scan direction) is referred to as a "column direction" of the irradiation region group 6 and another direction approximately along a sub scan direction (i.e., X direction) is referred to as a "row direction". The column direction of the irradiation region group 6 corresponds to a column direction of the micromirror group 222 and the row direction of the irradiation region group 6 corresponds to a row direction of the micromirror group 222.

Actually, a part of the micromirror group 222 in the DMD 22 are inactivated (i.e., ineffective) and the irradiation region group 6 is partially omitted to be an approximate rectangle. The details will be discussed later.

Since the irradiation region group 6 is fixed relatively to the light emitting part 2, when the stage moving mechanism 31 moves the stage 11 by control of the control part 4, the irradiation region group 6 continuously moves relatively to the photosensitive material in the main scan direction which is the Y direction in FIG. 1. The head part moving mechanism 32 moves the head part 20, and the irradiation region group 6 thereby intermittently moves in the sub scan direction (the X direction) perpendicular to the main scan direction. In other words, the stage moving mechanism 31 and the head part moving mechanism 32 function as an irradiation region moving mechanism for moving the irradiation region group 6 on the photosensitive material. Every time when main scanning of the irradiation region group 6 is finished by the stage moving mechanism 31, the irradiation region group 6 is moved to the next start position of main scanning by the head part moving mechanism 32.

Figure 5:
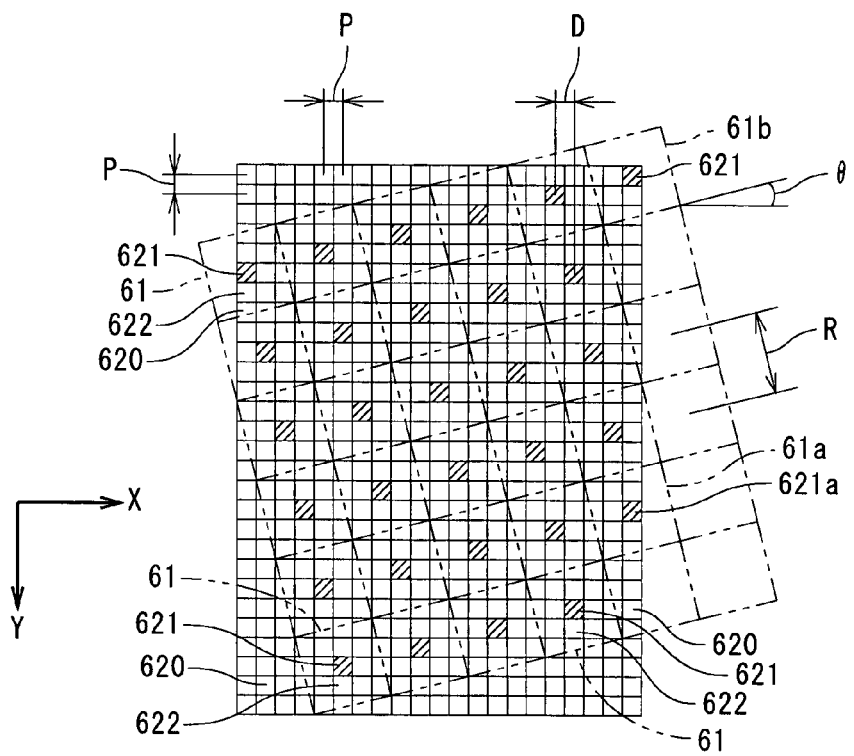
FIG. 5 is a view showing irradiation regions and writing regions overlapping one another.

FIG. 5 is a view showing the irradiation regions 61 and writing regions 620 overlapping one another on the substrate 9, the writing regions 620 being fixed on the substrate 9 to be a unit of writing. Since the irradiation regions 61, as above described, are fixed relative to the head part 20, the irradiation regions 61 move over the writing regions 620 by moving the head part 20 relatively to the substrate 9. In FIG. 5, the irradiation region group 6 corresponding to the micromirrors of the DMD 22 is indicated by dash-double-dot lines and a writing region group on the substrate 9 is indicated by solid lines. It is noted that only parts of the writing regions 620 and the irradiation regions 61 are shown in FIG. 5.

The writing regions 620 are square regions arranged at pitches P in both the X (sub scan) and Y (main scan) directions. The pitches P of the writing regions 620 are made equal to the smallest controllable unit of writing and is thus equal to the center-to-center distance D along the sub scan direction between two adjacent irradiation regions 61 arranged in the column direction. Thus, each of the writing regions 620 is positioned at the center of either one of the irradiation regions 61 (more precisely, continuously moving irradiation regions 61) at any point of time in control of light irradiation by the DMD 22. When the irradiation regions 61 pass over each of the writing regions 620, light irradiation according to writing cell data corresponding to that writing region 620 is performed centered about the writing region 620. The writing regions 620 may be rectangular regions arranged at different pitches in the sub scan and main scan directions.

When the center-to-center distance along the sub scan direction between two adjacent irradiation regions 61 arranged in the row direction is made equal to K times the pitch P of the writing regions 620 (that is, K writing regions 620 (or K addresses) are interpolated between two adjacent irradiation regions 61 arranged in the row direction), the angle θ formed between the row direction of the irradiation region group 6 and the X direction (sub scan direction) is expressed by the equation, θ=arctan(1/K). Accordingly, when four addresses are interpolated between adjacent irradiation regions 61 as shown in FIG. 5, the angle θ formed by the irradiation region group 6 is approximately 14 degrees and the pitch R of the irradiation regions 61 is equal to a value obtained by multiplying the pitch P of the writing regions 620 by the square root of 17.

Next, discussion will be made on the basic operation of the pattern writing apparatus 1 for writing a pattern on the photosensitive material on the substrate 9, referring to FIG. 6 and FIGS. 5, 7 and 8. The irradiation region group 6 is assumed to move relatively to the writing region group in both the main scan and sub scan directions in the following description about the operation of the pattern writing apparatus 1.

In pattern writing, first, when main scanning of the irradiation region group 6 is started and the irradiation region group 6 reaches a start position for pattern writing (Steps S1, S2), the controller 4 transmits a reset pulse to the DMD 22 and each of the micromirrors is tilted in a position (orientation) responsive to the writing cell data. Then, initial light irradiation of the first writing regions 621 located at the centers of the respective irradiation regions 61, out of the writing regions 620 in FIG. 5, that is to say, ON/OFF control of light irradiation to the irradiation regions 61 centered about the respective writing regions 621 is performed (Step S3).

Writing cell data at the initial light irradiation is transmitted from the control part 4 to corresponding memory cells of the respective micromirrors of the DMD 22 in advance. In Step S3, control for forcefully making a part of the micromirror group 222 to the OFF state (i.e., be inactivated) is performed as well as ON/OFF control of light irradiation to the irradiation regions 61. The details will be discussed later.

Figure 7:
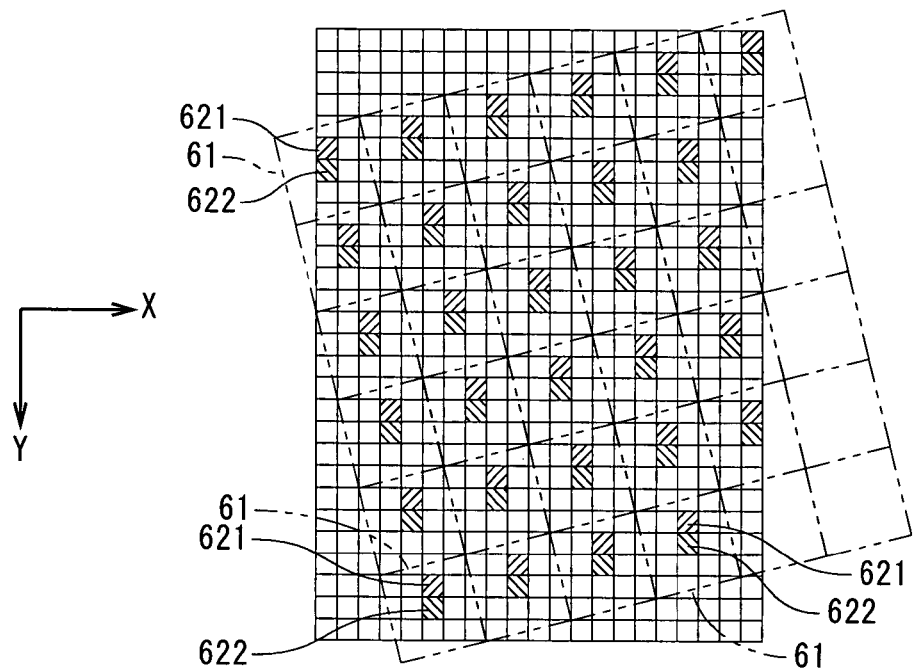
FIGS. 7 and 8 are views showing the irradiation regions and the writing regions in the process of writing.

After the transmission of the reset pulse, writing cell data corresponding to the next writing regions 622 (i.e., the writing regions 622 located adjacent to the writing regions 621 on the (+Y) side) is transmitted and written into memory cells of the respective micromirrors. The transmission of a reset pulse to the DMD 22 is performed in synchronization with the operation of the stage moving mechanism 31 for continuously moving the stage 11 in the main scan direction. More specifically, when the irradiation regions 61 move the pitch P in the main scan direction (the (+Y) direction in FIG. 5) after the application of the first reset pulse, the next reset pulse is transmitted to the DMD 22 and each of the micromirrors is tilted in a position responsive to the writing cell data. Thereby, as shown in FIG. 7, light irradiation on the writing regions 622 is performed with the second reset pulse.

Figure 8:
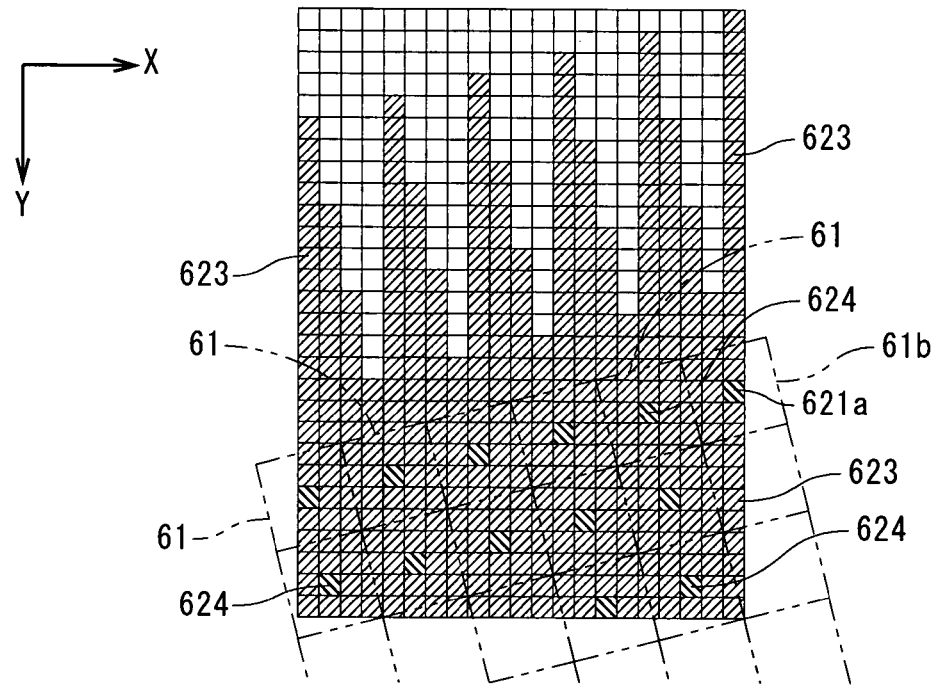

While the irradiation region group 6 passes over each of the writing regions 620 on the photosensitive material, control of light irradiation on each of the writing regions 620 is repeated and second light irradiation centered about the writing regions 621 which were irradiated with light by the first light irradiation is performed with the eighteenth reset pulse. FIG. 8 is a view illustrating light irradiation with the eighteenth reset pulse. In FIG. 8, writing regions 623 irradiated with light only once and writing regions 624 irradiated with light twice are distinguished by the direction of hatching.

Looking at, for example, a writing region 621a corresponding to an irradiation region 61a at the first reset pulse shown in FIG. 5, an irradiation region 61b as illustrated in FIG. 8 (located on the (−Y) side of the irradiation region 61a in FIG. 5) performs light irradiation centered about the writing region 621a with the eighteenth reset pulse. That is, the irradiation region 61b which is spaced four irradiation regions in the column (−Y) direction of the DMD 22 and one irradiation region in the row (+X) direction from the irradiation region 61a, passes over the writing region 621a, which was irradiated with light by the irradiation region 61a, and irradiates that writing region 621a with light for a second time.

Actually, since the irradiation region group 6 includes a large number of irradiation regions 61, the control part 4 repeatedly controls movement of the irradiation region group 6 and light irradiation on the respective irradiation regions 61 included in the irradiation region group 6 at high speed and then, a plurality of irradiation regions 61 pass over each position on the photosensitive material. With this operation, it is possible to apply a desired amount of light on each position and write a pattern on the photosensitive material. Since the column direction of the plurality of regions on the photosensitive material corresponding to the micromirror group 222 is inclined to the main scan direction, the pitches of the writing regions 620 becomes smaller than those of the irradiation region groups 6, thereby improving a resolution of a pattern to be written.

Light-emission control is repeated at high speed while moving the irradiation region group 6, it is stopped when the irradiation region group 6 reaches a stop position for pattern writing (Steps S3, S4), and main scanning of the irradiation region group 6 is also stopped (Step S5). With the above operation, light irradiation is performed on a region where the irradiation region group 6 passed on the photosensitive material, that is to say, light irradiation is performed on a strip-like region extending in the main scan direction (hereinafter, referred to as a "strip region"). The control part 4 confirms whether or not the next main scanning remains (Step S6), and when it is determined the next main scanning is necessary, the irradiation region group 6 moves in the sub scan direction (Step S7) and reaches the next start position of main scanning.

Then, the main scan direction is reversed to the (−Y) direction and Steps S1 to S6 are repeated. Specifically, when the irradiation region group 6 moves in the (−Y) direction and reaches a start position for pattern writing (Steps S1, S2) and the light-emission control is repeatedly performed (Steps S3, S4) and it is stopped when the irradiation region group 6 reaches a stop position for pattern writing (Step S5). With this operation, light irradiation on the next strip region is completed. In a case where it is determined another writing is necessary (Step S6), sub scanning of the irradiation region group 6 is performed (Step S7), the main scan direction is reversed to the (+Y) direction, and then Steps S1 to S6 are performed for light irradiation on the next strip region. As described above, the irradiation region group 6 moves in the sub scan direction every time when the main scanning is performed with reversing the main scan direction, generally discussing, with repeating main scanning of the irradiation region group 6 in parallel with the main scan direction which is the (+Y) and/or (−Y) directions in the pattern writing apparatus 1, and then writing is performed on the whole area to be written.

Figure 9:
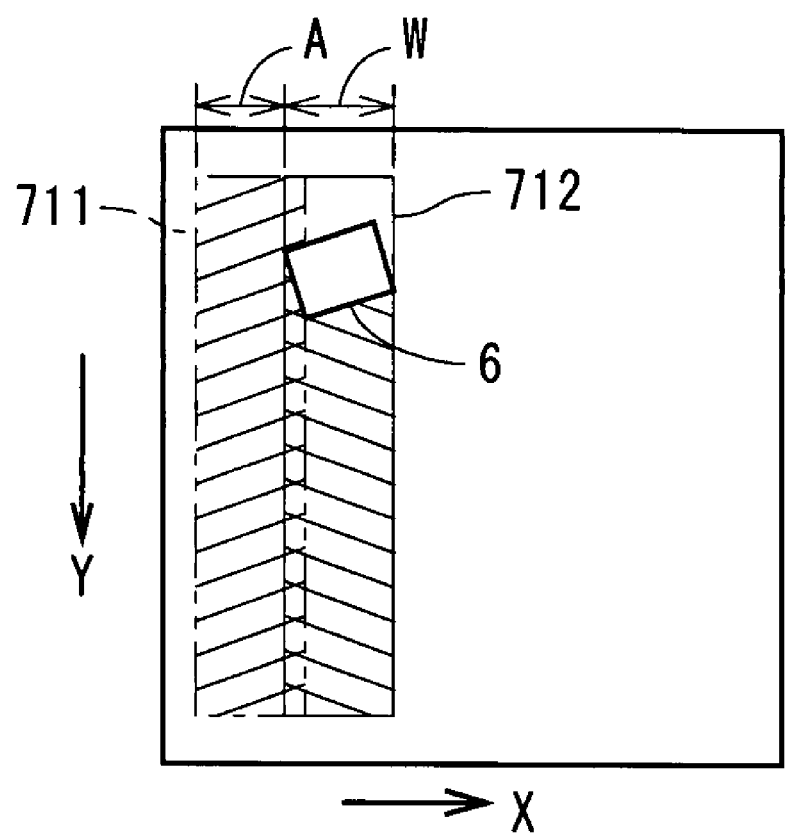
FIG. 9 is a view showing a state where the irradiation region group moves.

FIG. 9 is a view showing a movement of the irradiation region group 6. In FIG. 9, the irradiation region group 6 is shown as a rectangle, and the already-written strip region (hereinafter, referred to as "preceding strip region") is designated by the reference numeral 711 and the following strip region now being written (hereinafter, referred to as "following strip region") by 712. In the description referring to FIG. 9 and FIG. 10 which is later discussed, the irradiation region group 6 is regarded as a perfect rectangle with disregarding that a part of the micromirror group 222 are actually made inactivated in the pattern writing apparatus 1.

As shown in FIG. 4, the irradiation regions 61 are rectangularly arranged in the row and column directions perpendicular to each other within the irradiation region group 6, the column direction being inclined to the main scan direction. As shown in FIG. 9, the preceding strip region 711 and the following strip region 712 are spaced a distance A from each other in the sub scan direction ((+X) direction). A travel distance A of the irradiation region group 6 in the sub scan direction in one intermittent movement is smaller than the width of a single strip region that is defined by the width W of the irradiation region group 6 in the sub scan direction, and the preceding strip region 711 and the following strip region 712 partially overlap in the sub scan direction.

Figure 10:
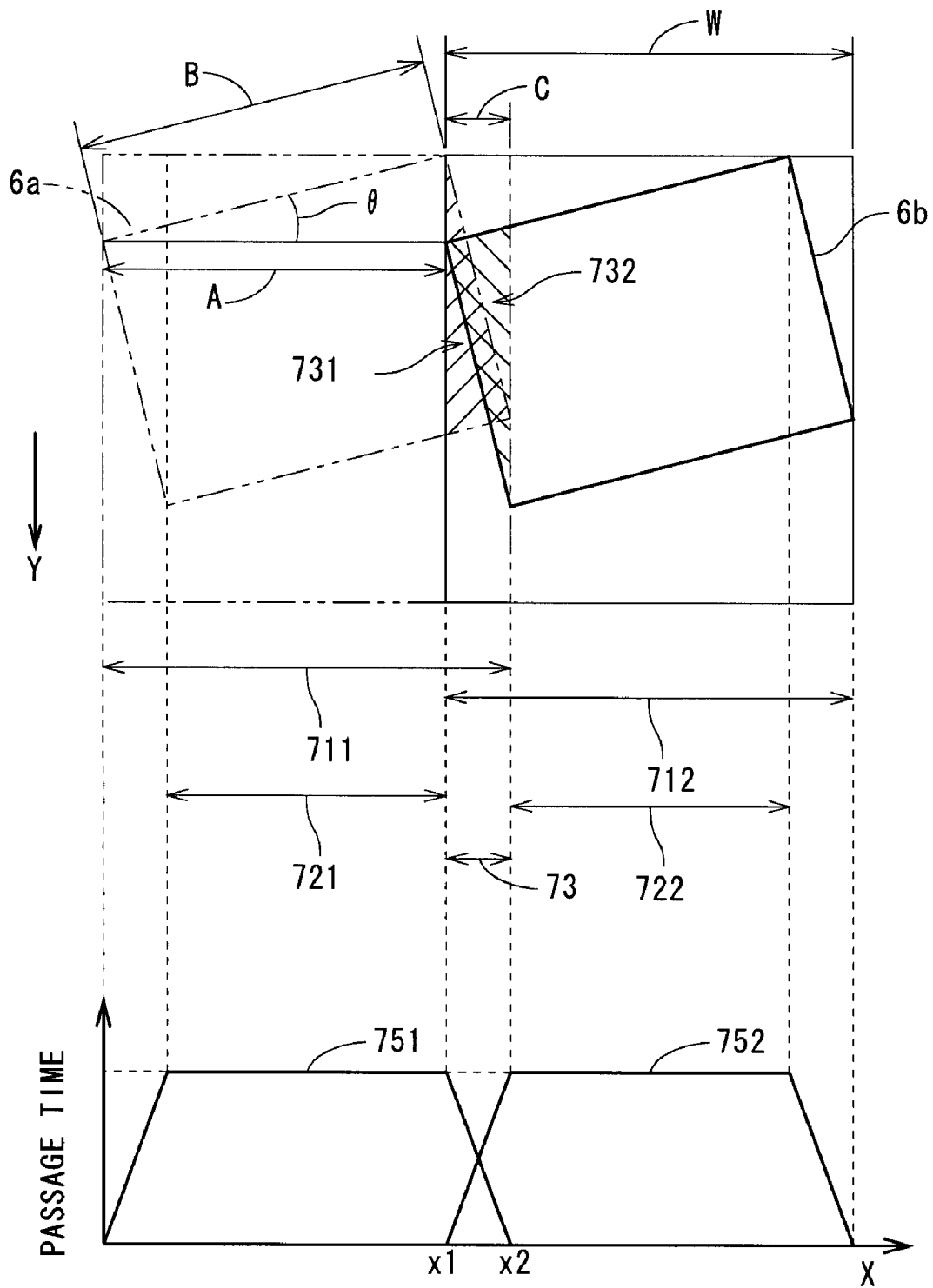
FIG. 10 is a view showing a relationship between a position in a sub scan direction and a passage time of the irradiation regions.

FIG. 10 is a view for explaining the relationship between a position in the sub scan direction on the photosensitive material and a passage time of the irradiation region group 6 in main scanning before and after sub scanning. The upper part of FIG. 10 illustrates an irradiation region group 6 on the preceding strip region 711 (the range in the width direction of the preceding strip region is represented by the reference numeral 711 and hereinafter, the irradiation region group 6 is referred to as "preceding irradiation region group 6a") and an irradiation region group 6 on the following strip region 712 (the range in the width direction of the following strip region is represented by the reference numeral 712 and hereinafter, that irradiation region group 6 is referred to as "following irradiation region group 6b") arranged side by side. The lower part of FIG. 10 shows the relationship between each position in the sub scan direction and the passage time of the preceding irradiation region group 6a and the following irradiation region group 6b, by polygonal lines.

As discussed above, light irradiation on the preceding irradiation region group 6a which is performed by the head part 20 of the light emitting part 2 is controlled and the preceding irradiation region group 6a previously moves in parallel with the main scan direction, to perform light irradiation on the preceding strip region 711 through control of the control part 4. Then, light irradiation on the following irradiation region group 6b performed by the head part 20 is controlled and the following irradiation region group 6b moves in parallel with the main scan direction, to perform light irradiation on the following strip region 712 which is adjacent to and partially overlaps with the preceding strip region 711. Though the above operations are equivalent to twice operations of Steps S1 to S5 in FIG. 6, Steps S1 to S5 may be subsequently performed by the same head part 20 or may be performed by different head parts 20, respectively, as discussed later.

In the pattern writing apparatus 1, as illustrated in the upper part of FIG. 10, the intermittent travel distance A of the irradiation region group 6 is made equal to a length which is obtained by projecting one side of the irradiation region group 6 onto a straight line extending in the sub scan direction, the one side being parallel to the row direction (i.e., one side extending approximately along the sub scan direction). That is, the intermittent travel distance A of the irradiation region group 6 is obtained from the equation, A=B×cos θ, where B is the length of one side of the irradiation region group 6, the one side being parallel to the row direction, and θ is the angle formed between the row direction of the irradiation region group 6 and the sub scan direction. A width C over which the preceding strip region 711 and the following strip region 712 overlap one another in the sub scan direction is equal to a length which is obtained by projecting one side in the column direction of the irradiation region group 6 onto a straight line extending in the sub scan direction. The width C is expressed by the equation, C=W−B×cos θ, where W is the width of the preceding irradiation region group 6a in the sub scan direction.

When the equation, A=B×cos θ, is satisfied, as illustrated in the upper part of FIG. 10, a right-triangle region of the preceding irradiation region group 6a on the right side, designated by 731, and a right-triangle region of the following irradiation region group 6b on the left side, designated by 732 overlap one another and both pass over an overlapping area 73 between the preceding strip region 711 and the following strip region 712 (the range in the width direction of the area is represented by the reference numeral 73 in FIG. 10). Hereinafter, the area 73 is referred to as an "overlapping area 73". An area over which a region other than right-triangle regions on the both sides of the preceding irradiation region group 6a passes over (the area extending in the main scan direction in the range designated by 721 in FIG. 10) is referred to as a "non-overlapping area 721". An area over which a region other than right-triangle regions on the both sides of the following irradiation region group 6b passes over (the area extending in the main scan direction in the range designated by 722 in FIG. 10) is referred to as a "non-overlapping area 722".

As indicated by the polygonal line 751 in the lower part of FIG. 10, a continuous passage time of the preceding irradiation region group 6a is constant in each position of the non-overlapping area 721 which belongs to the preceding strip region 711, while a passage time of the overlapping area 73 linearly decreases from the positions x1 to x2. As indicated by the polygonal line 752, a continuous passage time of the following irradiation region group 6b is constant in each position of the non-overlapping area 722 which belongs to the following strip region 712, similarly to the case of the non-overlapping area 721, while a passage time between the positions x1 and x2 linearly decreases from the positions x2 to x1.

Therefore, a cumulative passage time in which the preceding irradiation region group 6a and the following irradiation region group 6b pass the overlapping area 73 is equal to a passage time in which the preceding irradiation region group 6a or the following irradiation region group 6b passes the non-overlapping areas 721 or 722. As shown in FIG. 5, the irradiation region 61 passes over the same writing region 620 every four rows. In a case where the irradiation region group 6 has M rows, M/4 irradiation regions 61 substantially pass over each position of the non-overlapping areas 721 or 722, and also M/4 irradiation regions 61 substantially pass over each position of the overlapping area 73 through twice passings of irradiation regions 61. As a result, the entire substrate 9 can be irradiated with a (M/4)-step gradation centered about each of the writing regions 620.

When K addresses, instead of 4 addresses, are interpolated between two adjacent irradiation regions 61 arranged in the row direction, (M/K) irradiation regions 61 (M/K shall be an integer obtained by omitting fractions; the same is true in the following cases) pass over the non-overlapping areas 721 or 721 which belongs to the preceding strip regions 711 or 712. (M/K) irradiation regions 61 also pass over the overlapping area 73 by a pair of right-triangle regions 731 and 732. Thus, the entire substrate 9 can be irradiated with a (M/K)-step gradation centered about each of the writing regions 620.

Next, discussion will be made in a case where two head parts 20 concurrently move two irradiation region groups 6 on the substrate 9 in the pattern writing apparatus 1 (hereinafter, one head part 20 located on the (−X) side is referred to as "first head part 20*a*", and the other located on the (+X) is referred to as "second head part 20*b*").

Figure 11:
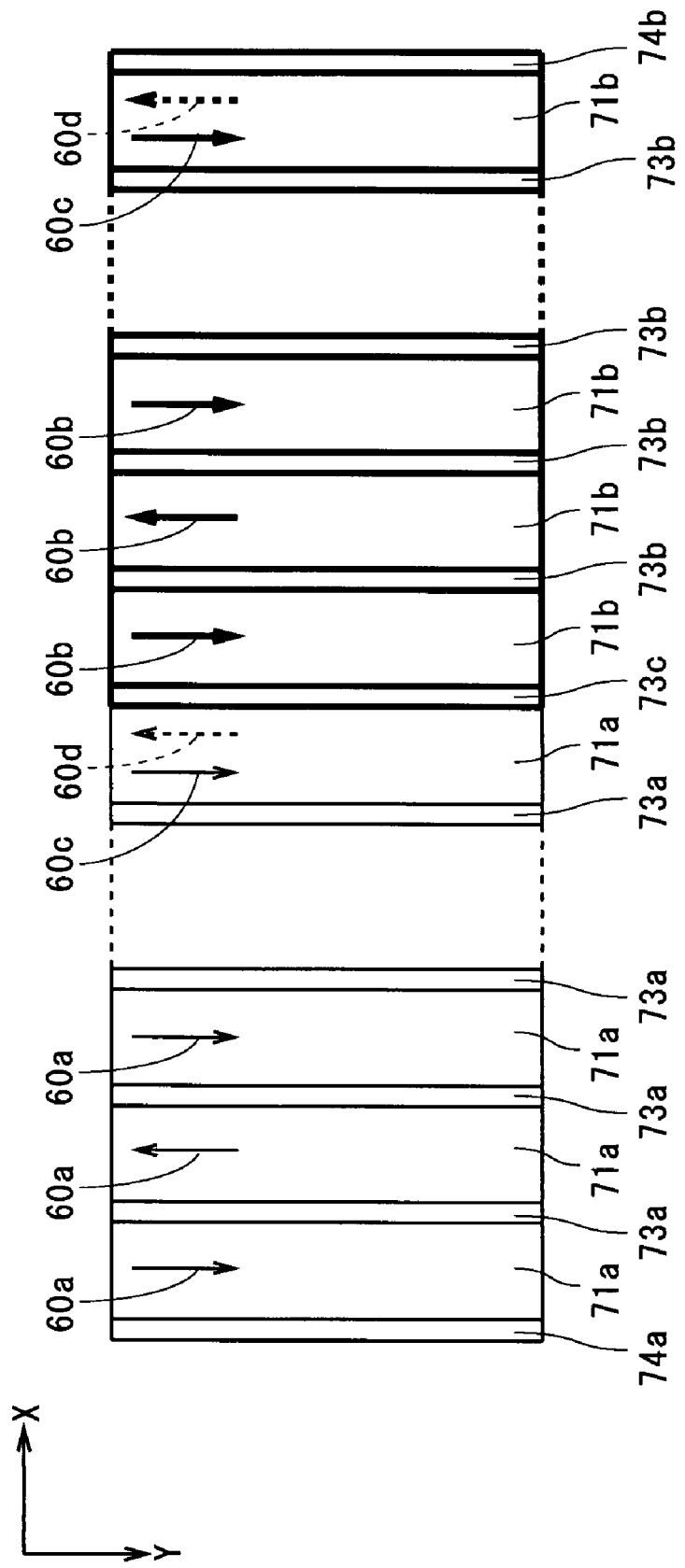
FIG. 11 is a view showing a state where writing is performed on a plurality of strip regions on a photosensitive material.

FIG. 11 is a view showing a state where writing is performed on a plurality of strip regions 71*a* and 71*b* on the photosensitive material by the two head parts 20. The strip regions 71*a* are regions on which light irradiation is performed by the first head part 20*a*, and the strip regions 71*b* are regions on which light irradiation is performed by the second head part 20*b*. As indicated by the arrows 60*a*, after the irradiation region group 6 corresponding to the first head part 20*a* moves in the main scan and sub scan directions which are the (+Y) and (+X) directions, respectively, the main scan direction is reversed to the (−Y) direction and the irradiation region group 6 moves in the (−Y) direction. Then, movement of the irradiation region group 6 in the sub scan direction, reversal of the main scan direction, and movement of the irradiation region group 6 in the main scan direction are repeated to sequentially perform light irradiation on the plurality of strip regions 71*a*.

The second head part 20*b* is provided with the same DMD 22 as the first head part 20*a* and it is fixed relatively to the first head part 20*a*. In other words, the light emitting part 2 has two DMDs 22 which are the spatial light modulators each of which has the same array of a plurality of light modulator elements, and the relative position of the two DMDs 22 is fixed. Therefore, as indicated by the arrows 60*b*, the irradiation region group 6 corresponding to the second head part 20*b* moves in the same manner as the irradiation region group 6 corresponding to the first head part 20*a*. That is to say, movement of the irradiation region group 6 in the main scan direction, movement of the irradiation region group 6 in the sub scan direction, and reversal of the main scan direction are repeated to sequentially perform light irradiation on the plurality of strip regions 71*b*. The reference numeral 60*c* represents a direction of the last main scanning (the (+Y) direction) in a case where main scanning of each irradiation region group 6 is performed by an odd number of times, and the reference numeral 60*d* represents a direction of the last main scanning (the (−Y) direction) in a case where the main scanning is performed by an even number of times.

Looking at a pair of adjacent strip regions 71*a* out of the plurality of strip regions 71*a*, a strip region 71*a* located on the (−X) side corresponds to the preceding strip region 711 in FIGS. 9 and 10, and a strip region 71*a* located on the (+X) side corresponds to the following strip region 712 in FIGS. 9 and 10. An overlapping area 73*a* between these strip regions 71*a* corresponds to the overlapping area 73 in FIG. 10. Similarly, looking at a pair of adjacent strip regions 71*b*, a strip region 71*b* located on the (−X) side corresponds to the preceding strip region, a strip region 71*b* located on the (+X) side corresponds to the following strip region, and an overlapping area 73*b* between the strip regions 71*b* corresponds to the overlapping area 73. Accordingly, one DMD 22 functions as the spatial light modulator for applying light to the preceding irradiation region group 6*a* and the following irradiation region group 6*b* in turn, with respect to the above strip regions 71*a*, 71*b*.

As shown in FIG. 11, a strip region 71*b* at the end on the (−X) side (i.e., the region where light irradiation is performed at first) and a strip region 71*a* at the end on the (+X) side (i.e., the region where light irradiation is lastly performed) are made partially overlapped each other over an overlapping area 73*c*, similarly to the two strip regions 711, 712 shown in FIG. 10, and a cumulative passage time in which two irradiation region groups 6 pass the overlapping area 73*c* is equal to a passage time in which one irradiation region group 6 passes the non-overlapping area. Therefore, since the strip region 71*b* corresponds to the preceding strip region and the strip region 71*a* corresponds to the following strip region, location of these strip regions 71*b* and 71*a* is considered as a state where the strip regions 711, 712 in FIG. 10 are switched. As a result, the two DMDs 22 perform light irradiation on the preceding irradiation region group 6*a* and the following irradiation region group 6*b* in the light emitting part 2, respectively.

An area 74*a* located on the (−X) side of the strip region 71*a* where writing is performed at first corresponds to a right triangle on the (−X) side of the irradiation region group 6. Since a passage time in which the irradiation region group 6 passes the area 74*a* does not satisfy a passage time in which the irradiation region group 6 passes the non-overlapping area, the area 74*a* is not used for writing. Similarly, an area 74*b* located on the (+X) side of the strip region 71*b* where writing is lastly performed is not used for writing.

As discussed above, since the irradiation region group 6 passes the overlapping area between the strip regions where writing is performed by the same head part 20 and the overlapping area between the strip regions where writing is performed by the different head parts 20, by two times, it is possible to efficiently perform writing with the two head parts 20 and write a fine pattern at high speed in the pattern writing apparatus 1.

Though the construction and operations of the pattern writing apparatus 1 are described based on the premise that the irradiation region group 6 is a rectangle, there is a case where a degree of photo reaction is different depending on a photosensitive material, between one irradiation of an amount of light for a short time and twice irradiations of the same amount of light with an interval (normally, the degree of photo reaction in twice irradiations is larger than one irradiation). Therefore, when light irradiation to such a photosensitive material is repeated with an interval in the overlapping areas 73*a*, 73*b* written by the same head part 20 and the overlapping area 73*c* written by the different head parts 20 in FIG. 11 in the pattern writing apparatus 1, the degree of photo reaction in the overlapping area is larger than the other area to cause a thickness of line in a pattern partially greater or striped unevenness occur in the pattern.

Then, a part of the micromirror group 222 corresponding to the overlapping area, that is to say, a part of micromirrors whose projection positions on the photosensitive material exist on the overlapping area, out of the micromirror group 222 (see FIG. 3) in the DMD 22, are made inactivated in writing of at least one of the preceding strip region and the following strip region in the pattern writing apparatus 1, and an amount of light applied to the overlapping area is thereby forced to decrease. As a result, the degree of photo reaction in the overlapping area is made equal to that in the non-overlapping area and occurrence of unevenness in the written pattern is suppressed.

Making a part of the micromirror group 222 inactivated (i.e., ineffective) means forcefully keeping a part of the micromirrors in the OFF state, and the shape of the irradiation region group 6 changes from a rectangle by making a part of the micromirrors inactivated (or a rectangular region group corresponding to the micromirror group 222 is formed by virtual irradiation regions without relation to writing and effective irradiation regions 61 used for writing). Since many irradiation regions 61 pass over one writing region to repeatedly perform light irradiation as shown in FIG. 8 in the pattern writing apparatus 1, even if a part of the micromirror group 222 are made inactivated, a cumulative amount of light only decreases at uniform rate with respect to the main scan direction and the written pattern is not influenced.

Figure 12A:
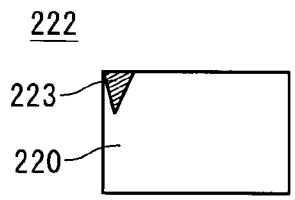
FIG. 12A is a view showing a state of a micromirror group.

FIG. 12A is a view showing a state of the micromirror group 222 when light irradiation is performed on the strip regions other than those irradiated with light at first and lastly, out of the strip regions 71a, 71b in FIG. 11. A portion indicated by the reference numeral 223 is inactivated micromirrors and the rest portion indicated by the reference numeral 220 is effective, i.e., activated micromirrors which are ON/OFF controlled.

Figure 12B:
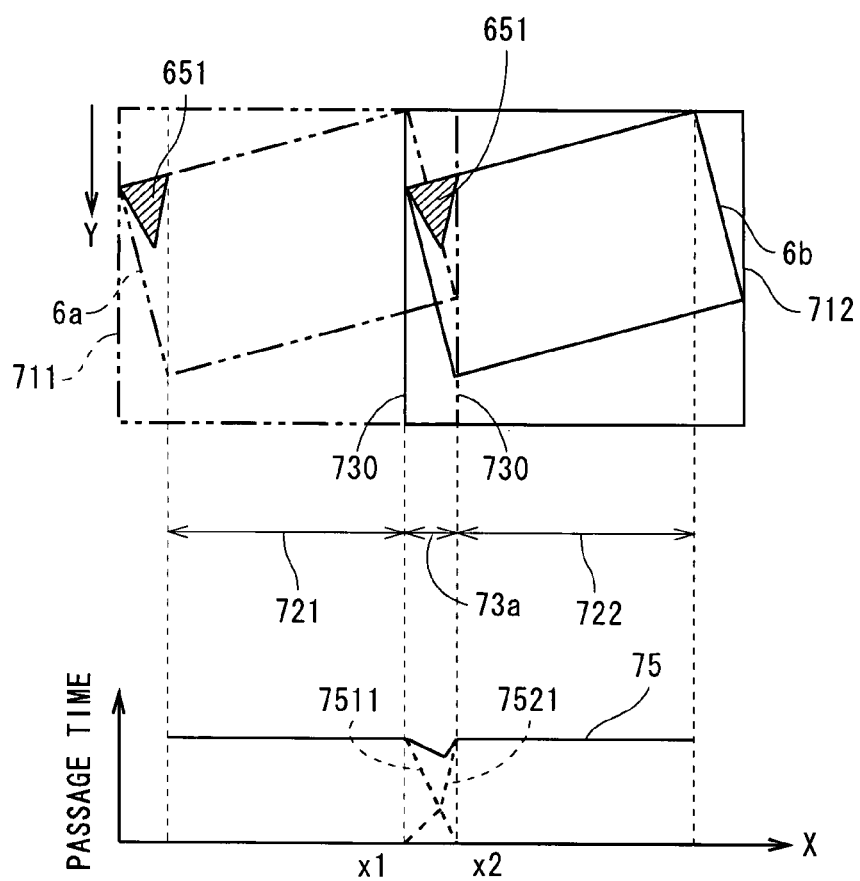
FIG. 12B is a view showing a state where light irradiation is performed on a preceding strip region and a following strip region.

FIG. 12B is a view showing a case where light irradiation is performed on the preceding strip region 711 and the following strip region 712 (both correspond to the strip region 71a or the strip region 71b in FIG. 11) with using the micromirror group 222 shown in FIG. 12A. Similarly to FIG. 10, the upper part illustrates the irradiation region groups and the strip regions, and the lower part illustrates a passage time in which the irradiation region groups pass each position in the sub scan direction, by the line 75. The passage time only shows portions corresponding to the non-overlapping area 721 in the preceding strip region 711, an overlapping area between the both strip regions (the overlapping area corresponds to the overlapping area 73a or 73b in FIG. 11, and hereinafter referred to as "overlapping area 73a"), and the non-overlapping area 722 in the following strip region 712. The ranges of the non-overlapping area 721, the overlapping area 73a, and the non-overlapping area 722, which extend in the main scan direction, are represented by the reference numerals 721, 73a, and 722 in FIG. 12B.

In FIG. 12B, the preceding irradiation region group 6a and the following irradiation region group 6b have a shape where an area 651 (hereinafter, referred to as "mask area 651") is removed from a rectangle, and the mask area 651 corresponds to the inactivated micromirrors 223 in FIG. 12A. Irradiation regions on the photosensitive material corresponding to light modulator elements which are activated in writing of the preceding strip region and the following strip region are the preceding irradiation region group 6a and the following irradiation region group 6b, respectively. In other words, the region group on the photosensitive material corresponding to the micromirror group 222 is arranged in the row and column directions which are perpendicular to each other in a rectangular form, the column direction being tilted to the main scan direction. Out of the region group, regions used for writing constitute the irradiation region group 6 and regions which are not used for writing constitute the mask area 651.

The mask area 651 forming a rectangle together with the following irradiation region group 6b (i.e., the mask area 651 which is adjacent to the following irradiation region group 6b) is included in the overlapping area 73a, and the mask area 651 forming a rectangle together with the preceding irradiation region group 6a is also included in the overlapping area between a strip region which is adjacent on the (−X) side and the preceding irradiation region group 6a. Therefore, the passage time of the preceding irradiation region group 6a or the following irradiation region group 6b is constant in the non-overlapping areas 721, 722, similarly to the case of FIG. 10. Though discussion will be made on the mask area 651 contacting with the following irradiation region group 6b in the following description, the following irradiation region group 6b discussed here can be applied to the irradiation region group 6 for writing any strip region other than the strip regions irradiated with light at first and lastly, out of the strip regions 71a, 71b in FIG. 11.

The mask area 651 is a triangle which contacts a side on the (−Y) side of the following irradiation region group 6b, and a width in the main scan direction of the mask area 651 thereby increases as it gets away from borders 730 between the non-overlapping areas 721, 722 and the overlapping area 73a. For fine writing, however, an apex at the end on the (+Y) side (on the lower part of FIG. 12B) of the mask area 651 is not located in the central portion of the overlapping area 73a but slightly close to the side of the non-overlapping area 722 (the side of the non-overlapping area which is written when the mask area passes the overlapping area). In other words, the number of regions arranged in the main scan direction, which correspond to the inactivated micromirrors 223, increases as it gets away from the borders 730 in at least in the vicinity of the borders 730 between the overlapping area 73a and the non-overlapping areas 721, 722. The size of the mask area 651 and the position of the apex on the (+Y) side is changed with characteristics of a photosensitive material as appropriate.

Though the passage time where the preceding irradiation region group 6a passes the overlapping area 73a linearly decreases from the positions x1 to x2 as indicated by the broken line 7511 in the lower part of FIG. 12B, similarly to the case of FIG. 10, the degree of increase in the passage time in which the following irradiation region group 6b passes the overlapping area 73a is suppressed by the mask area 651 until some point from the positions x1 to x2 as indicated by the broken line 7521. As a result, a cumulative passage time in which the preceding irradiation region group 6a and the following irradiation region group 6b pass each position of the overlapping area 73a is shorter than a constant passage time where the preceding irradiation region group 6a or the following irradiation region group 6b passes the non-overlapping area 721 or 722. Also, the cumulative passage time in which the preceding irradiation region group 6a and the following irradiation region group 6b pass each position of the overlapping area 73a decreases as it gets away from the borders 730 in at least in the vicinity of the borders 730 between the overlapping area 73a and the non-overlapping areas 721, 722.

Consequently, an amount of light applied to the overlapping area 73a is forced to decrease from an amount of light indicated by writing data and the degree of photo reaction in the overlapping area 73a is made equal to that in the non-overlapping areas 721, 722, thereby achieving fine quality of writing.

Figure 13A:
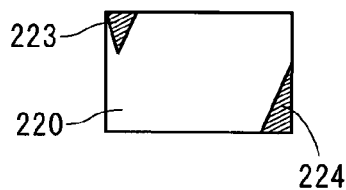
FIGS. 13A and 13B are views showing a state of the micromirror group.
Figure 13B:
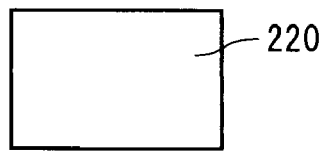

FIG. 13A is a view showing a state of the micromirror group 222 when light irradiation is performed on the strip region 71a which is lastly irradiated with light, and FIG. 13B is a view showing a state of the micromirror group 222 when light irradiation is performed on the strip region 71b which is irradiated with light at first. In FIG. 13A, a portion indicated by the reference numeral 223 is inactivated micromirrors similarly to the case of FIG. 12A, a portion indicated by the reference numeral 224 is also inactivated micromirrors, and the rest portion indicated by the reference numeral 220 is effective, i.e., activated micromirrors which are ON/OFF controlled. In FIG. 13B, the whole micromirror group 222 is activated as shown by the reference numeral 220.

Figure 13C:
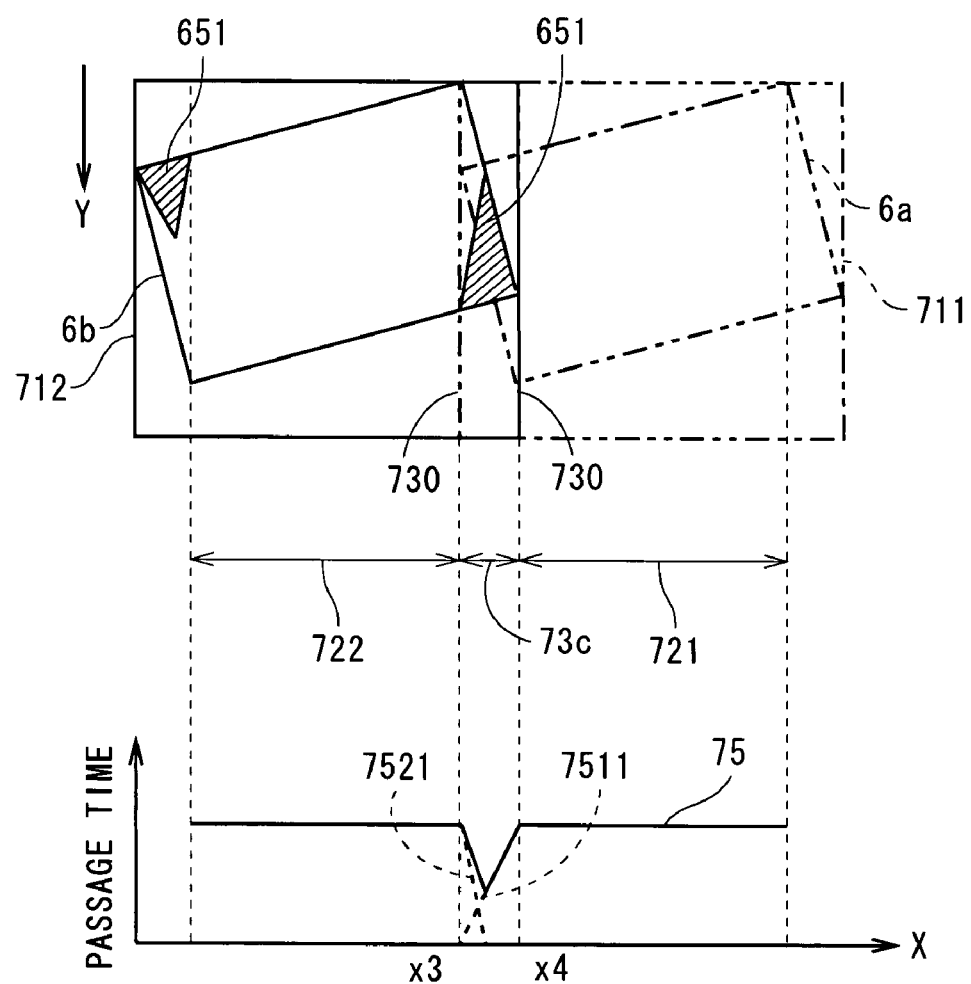
FIG. 13C is a view showing a state where light irradiation is performed on the preceding strip region and the following strip region.

FIG. 13C is a view showing a case where light irradiation is performed on the preceding strip region 711 (corresponding to the strip region 71b at the end on the (−X) side in FIG. 11) with using the micromirror group 222 shown in FIG. 13B, and also light irradiation is performed on the following strip region 712 (corresponding to the strip region 71a at the end on the (+X) side in FIG. 11) with using the micromirror group 222 shown in FIG. 13A. The upper part illustrates the irradiation region groups and the strip regions and the lower part illustrates the passage time in which the irradiation region groups pass each position in the sub scan direction, by the line 75. The passage time only shows portions corresponding to the non-overlapping area 721 in the preceding strip region 711, an overlapping area 73c between the both strip regions, and the non-overlapping area 722 in the following strip region 712. Also in FIG. 13C, the ranges of the non-overlapping area 721, the overlapping area 73c, and the non-overlapping area 722, which extend in the main scan direction, are represented by the reference numerals 721, 73c, and 722.

In FIG. 13C, the preceding irradiation region group 6a is a rectangle and the following irradiation region group 6b has a shape where a mask area 651 and another mask area 652 are removed from a rectangle. The mask area 651 corresponds to the inactivated micromirrors 223 in FIG. 13A and the mask area 652 corresponds to the inactivated micromirrors 224. That is, regions used for writing constitute the preceding irradiation region group 6a (or the following irradiation region group 6b) and regions which are not used for writing constitute the mask areas 651, 652, out of the region group on the photosensitive material corresponding to the micromirror group 222.

The mask area 651 has the same function as the mask area 651 in FIG. 12B, and the degree of photo reaction in the overlapping area between the following strip region 712 and the preceding strip region located on the (−X) side (not shown) can be made equal to that in the non-overlapping area 721. The another mask area 652 is included in the overlapping area 73c between the preceding strip region 711 on the (+X) side and the following strip region 712. Therefore, the passage time of the irradiation region group 6a, 6b is constant in the non-overlapping areas 721, 722, similarly to the case of FIG. 10.

The mask area 652 is a right triangle contacting with sides on the (+Y) and (+X) sides of the following irradiation region group 6b, and a width in the main scan direction of the mask area 652 thereby increases as it gets away from borders 730 between the non-overlapping areas 721, 722 and the overlapping area 73c. For fine writing, an apex at the end on the (−Y) side (on the upper part of FIG. 13C) of the mask area 652 is not located in the central portion of the overlapping area 73c but slightly close to the side of the non-overlapping area 722 (the side of the non-overlapping area which is written when the mask area passes the overlapping area). The size of the mask area 651 and the position of the apex on the (−Y) side is changed with characteristics of a photosensitive material as appropriate.

Though the passage time in which the preceding irradiation region group 6a passes the overlapping area 73c linearly decreases from the positions x4 to x3 as indicated by the broken line 7511, the degree of increase in the passage time where the following irradiation region group 6b passes the overlapping area 73c is suppressed from the positions x4 to x3 until some point as indicated by the broken line 7521 similarly to the case of FIG. 12B, by providing the mask area 652 in an overlapping portion between the overlapping area 73c included in the following irradiation region group 6b and the preceding irradiation region group 6a. As a result, a cumulative passage time in which the preceding irradiation region group 6a and the following irradiation region group 6b pass each position of the overlapping area 73c is shorter than a constant passage time where the preceding irradiation region group 6a or the following irradiation region group 6b passes the non-overlapping area 721 or 722, as indicated by the line 75. The cumulative passage time in which the preceding irradiation region group 6a and the following irradiation region group 6b pass each position of the overlapping area 73c decreases as it gets away from the borders 730 in at least in the vicinity of the borders 730 between the overlapping area 73c and the non-overlapping areas 721, 722.

Consequently, an amount of light applied to the overlapping area 73c between the region written by the first head part 20a and the region written by the second head part 20b is forced to decrease from an amount of light indicated by writing data and the degree of photo reaction in the overlapping area 73c can be made equal to that in the non-overlapping areas 721, 722, to achieve fine quality of writing. Particularly, a time period from when the preceding irradiation region group 6a passes the overlapping area 73c to when the following irradiation region group 6b passes the overlapping area 73c is extremely long (when one head part 20 writes n strip regions, an average of differences between writing times is a time period for writing (n−1) strip regions) and the degrees of photo reaction in the overlapping area and the non-overlapping area are different in many kinds of photosensitive material, so the technique for providing the mask area 652 is important.

In the actual operation, when writing for the strip region 71a at the end on the (−X) side is performed, light irradiation is not performed on the region 74a at the end on the (−X) side shown in FIG. 11 and the micromirror group 222 shown in FIG. 13B is therefore used similarly to writing of the strip region 71b at the end on the (−X) side. Also when writing for the strip region 71b at the end on the (+X) side is performed, light irradiation is not performed on the region 74b at the end on the (+X) side and the micromirror group 222 shown in FIG. 13A is therefore used. As a result, the same mask area is used in the DMDs 22 in the two head parts 20.

Figure 14:
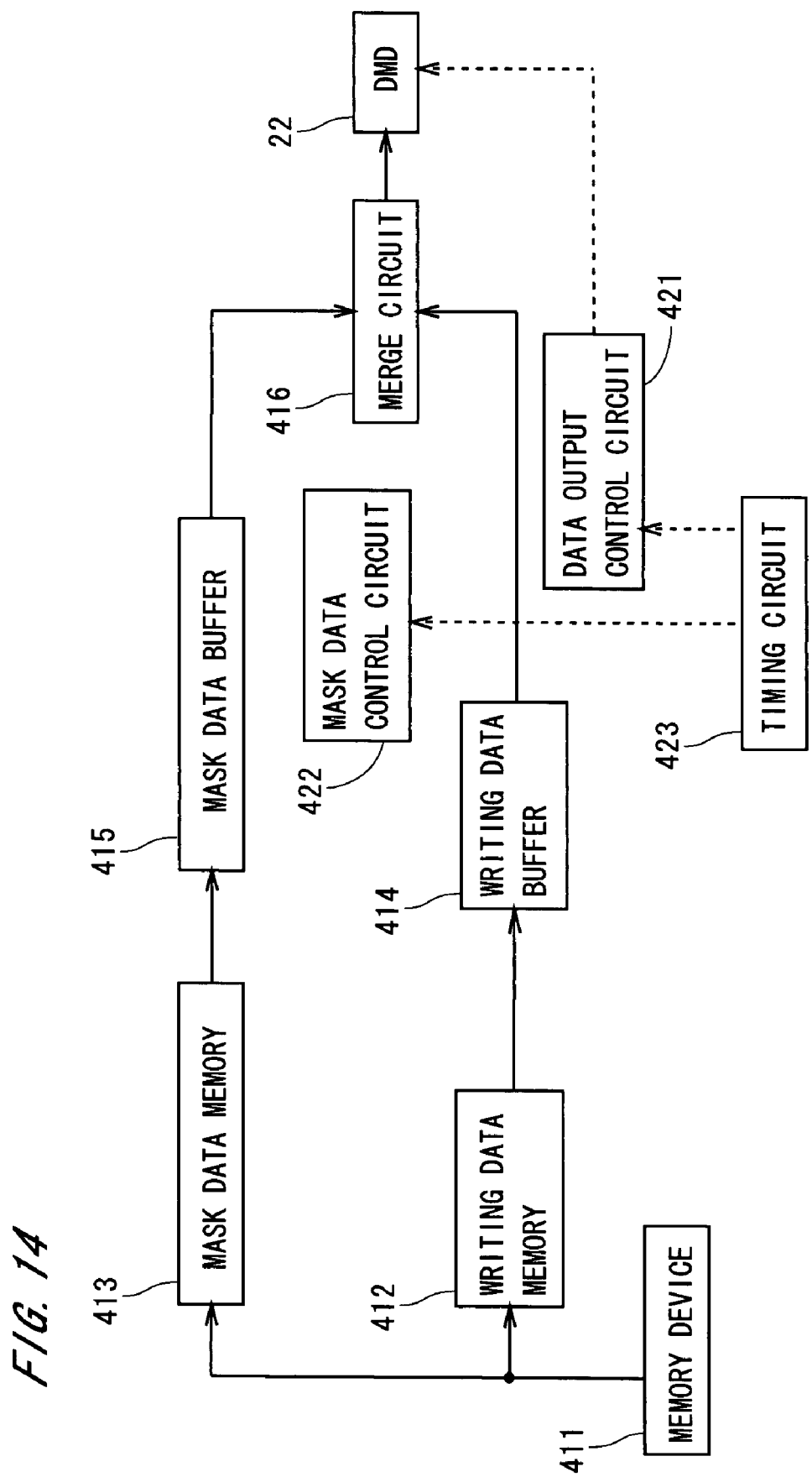
FIG. 14 is a block diagram showing constituent elements for controlling the DMD.

FIG. 14 is a block diagram showing constituent elements of the control part 4 required for controlling one DMD 22. The constituent elements shown in FIG. 14 are provided for each of the two DMDs 22 in the control part 4. The control part 4 has a memory device 411 for storing various information, a writing data memory 412 for storing writing data representing the whole (or a wide-ranging portion of) writing pattern, and a mask data memory 413 for storing mask data representing the area of the inactivated micromirrors which are shown in FIGS. 12A and 13A. Writing data and mask data from the memory device 411 can be read out to the writing data memory 412 and the mask data memory 413.

A writing data buffer 414 for temporarily storing writing data used for one light-emission control out of writing data is connected to the writing data memory 412, and a mask data buffer 415 for temporarily storing one of a plurality of mask data is connected to the mask data memory 413. The writing data buffer 414 and the mask data buffer 415 are connected to a merge circuit 416 for synthesizing the both data (for example, for obtaining a logical product of corresponding values of the both data to merge them). Synthesized writing data is transmitted to the DMD 22 as writing cell data which is stored in respective memory cells of the micromirrors.

Control for outputting the writing cell data from the writing data memory 412 through the writing data buffer 414 and the merge circuit 416 to the DMD 22 is performed by a data output control circuit 421. Control for transferring the mask data from the mask data memory 413 to the merge circuit 416 through the mask data buffer 415 is performed by a mask data control circuit 422. Operations of the data output control circuit 421 and the mask data control circuit 422 are synchronized by the timing circuit 423.

Figure 6:
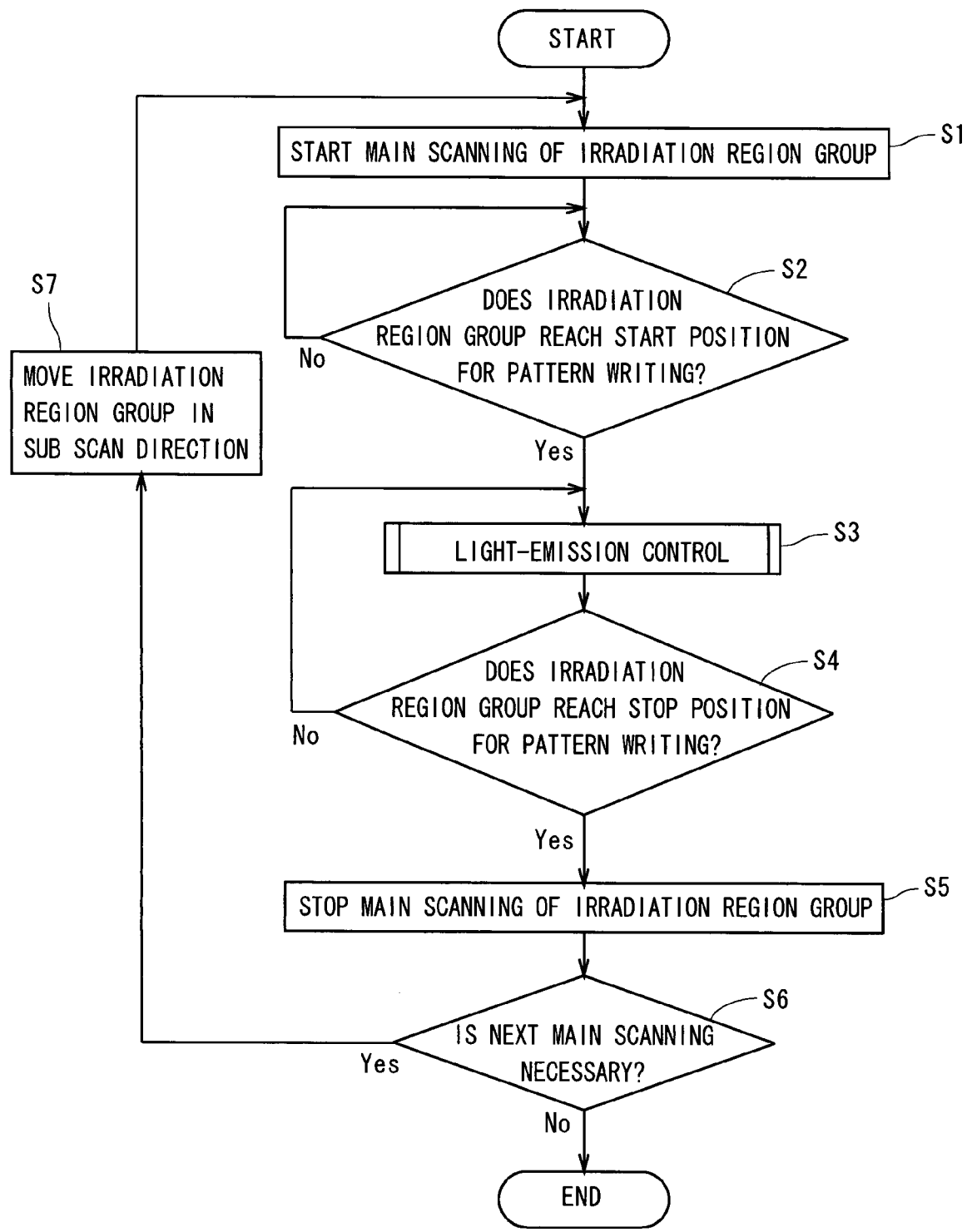
FIG. 6 is a flow chart showing an operation flow of a basic operation for pattern writing.
Figure 15:
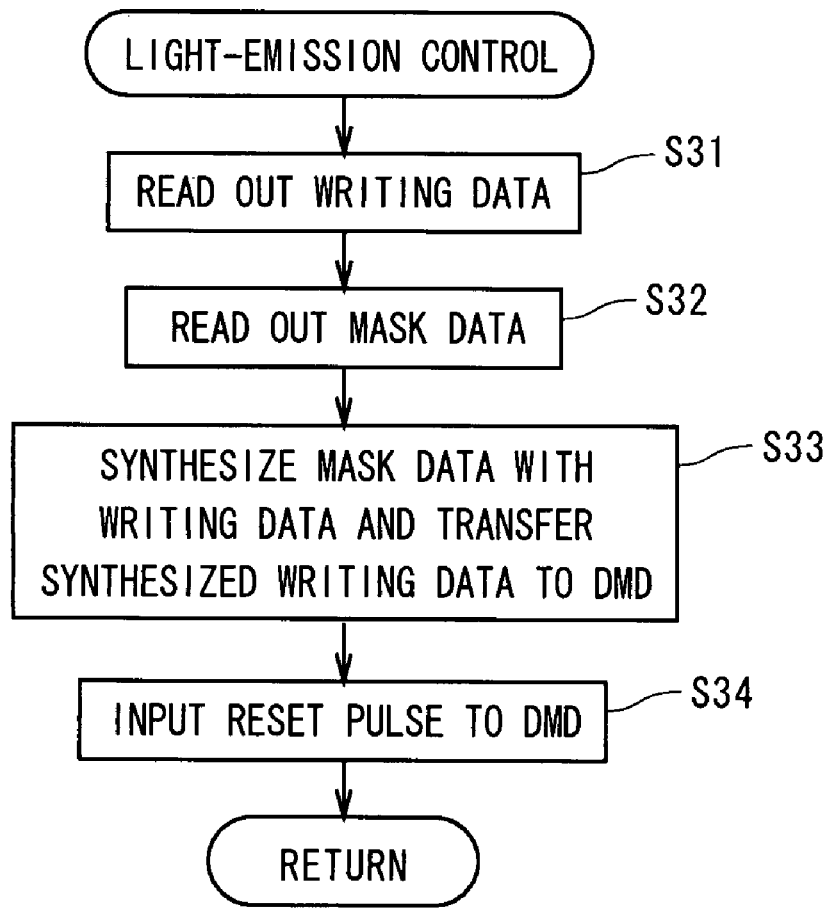
FIG. 15 is a flow chart showing an operation flow for light-emission control.

FIG. 15 is a flowchart showing an operation flow of Step S3 in FIG. 6, where the control part 4 controls light irradiation to the photosensitive material performed by the light emitting part 2. Actually, the operations shown in FIG. 15 are performed to each of the two DMDs 22 at the same time.

In one light-emission control (Step S3), first, writing data corresponding to a position of the irradiation region group 6 is specified from writing data stored in the writing data memory 412 in advance and the specified writing data is read out to the writing data buffer 414 (Step S31). When mask data which is already stored in the mask data buffer 415 is different from mask data to be used, one of a plurality of mask data which are stored in the mask data memory 413 is read out to the mask data buffer 415 (Step S32). Step S32 is not performed when the mask data which is already stored in the mask data buffer 415 is the same as that to be used.

For example, in the initial light-emission control of the strip regions which are written at first, out of the strip regions 71a, 71b in FIG. 11, the mask data without indicating the mask area is read out to the mask data buffer 415 (see FIG. 13B), and the mask data indicating only the mask areas 651 shown in FIG. 12B is read out to the mask data buffer 415 in the initial light-emission control of the strip regions 71a, 71b which are secondly written (see FIG. 12A). In the initial light-emission control of the strip regions which are lastly written, out of the strip regions 71a, 71b, the mask data indicating the mask areas 651, 652 shown in FIG. 13C is read out to the mask data buffer 415 (see FIG. 13A). Rewriting of the mask data is not performed in the initial light-emission control of the other strip regions and the subsequent light-emission controls of each strip region.

The writing data and the mask data which are stored in the writing data buffer 414 and the mask data buffer 415 are synthesized in the merge circuit 416 and the writing cell data corresponding to the mask area is forcefully replaced with 0. The synthesized writing data is written into the memory cell of each of the micromirrors in the DMD 22 at a predetermined timing (Step S33). When the irradiation region group 6 which is moved on the photosensitive material reaches a desired position, a reset pulse is inputted to the DMD 22 from the timing circuit 423 of the control part 4 and then, each of the micromirrors is tilted in a position responsive to the writing cell data which is written into the corresponding memory cell, to become the ON state or the OFF state (Step S34). At this time, since the micromirrors corresponding to the mask area are surely made to the OFF state, it is possible to practically achieve inactivation of the micromirrors corresponding to the mask area.

Thereafter, the operation is rapidly returned back to Step S31 from Step S4 shown in FIG. 6, and light-emission control where the micromirror group 222 is partially inactivated is repeated at high speed until the irradiation region group 6 reaches a stop position for pattern writing. There may be a case where the order of reading out the writing data (Step S31) and reading out the mask data (Step S32) is changed and Steps S31 and S32 are performed at the same time.

Though the construction and operations of the pattern writing apparatus 1 have been discussed above, the amount of light applied to the overlapping area between the two strip regions which are successively written is forcefully reduced by making a part of the micromirror group 222 in the DMD 22 inactivated in the pattern writing apparatus 1, and the degrees of photo reaction in the non-overlapping area and the overlapping area are made equal, thereby suppressing occurrence of unevenness in the written pattern. Further, the amount of light applied to the overlapping area between the two adjacent strip regions which are written by the different head parts 20 is forcefully reduced and occurrence of unevenness in the overlapping area can be suppressed. As a result, it is possible to appropriately write a pattern on the whole writing region on the photosensitive material.

Figure 16A:
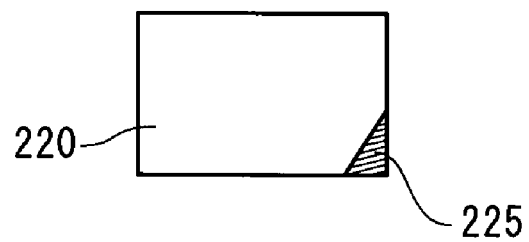
FIG. 16A is a view showing a state of the micromirror group.
Figure 16B:
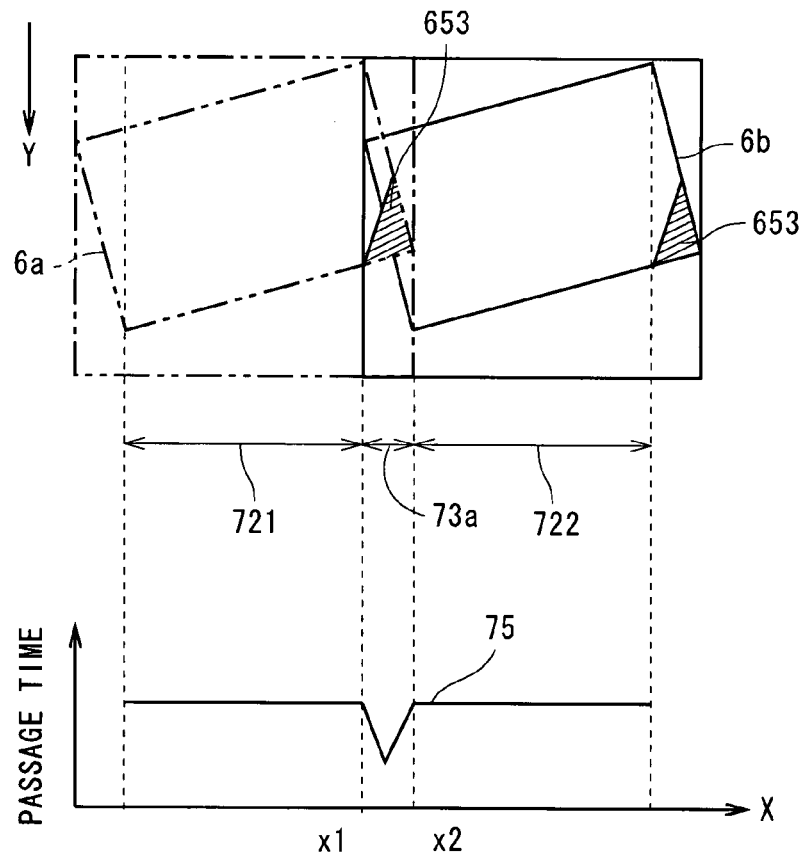
FIG. 16B is a view showing a state where light irradiation is performed on the preceding strip region and the following strip region.

FIG. 16A is a view showing another micromirror group 222 corresponding to FIG. 12A and FIG. 16B corresponds to FIG. 12B. Elements in FIGS. 16A and 16B are represented by the same reference numerals as in FIGS. 12A and 12B. In the micromirror group 222 shown in FIG. 16A, micromirrors 225 which are made inactivated are set on the opposite (diagonal) side to the micromirrors 223 contained in the micromirror group 222 shown in FIG. 12A. Therefore, as shown in FIG. 16B, a mask area 653 is set in the preceding irradiation region group 6a which belongs to an overlapping area 73a. As a result, a cumulative passage time in which the preceding irradiation region group 6a and the following irradiation region group 6b pass the overlapping area 73a is shorter than a passage time of the non-overlapping areas 721, 722 similarly to the case of FIG. 12B, as indicated by the line 75. A position where the cumulative passage time is shortest is not located in the central portion of the overlapping area 73a but slightly close to the side of the non-overlapping area 721 (the side of the non-overlapping area which is written when the mask area passes the overlapping area).

Figure 17A:
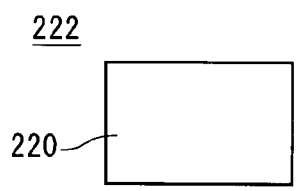
FIGS. 17A and 17B are views showing a state of the micromirror group.
Figure 17B:
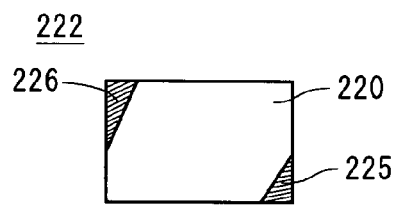
Figure 17C:
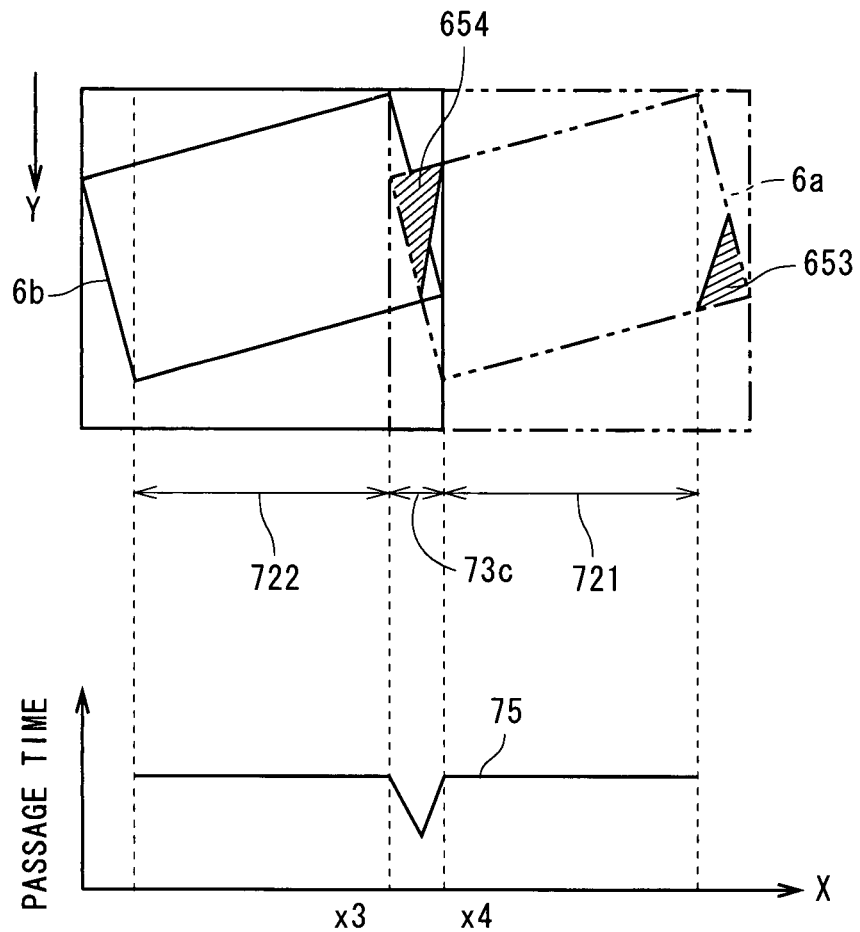
FIG. 17C is a view showing a state where light irradiation is performed on the preceding strip region and the following strip region.

FIGS. 17A and 17B are views showing other micromirror groups 222 corresponding to FIGS. 13A and 13B. The micromirror group 222 in FIG. 17A is used for light irradiation on the strip region 71a in FIG. 11 which is lastly written, and the micromirror group 222 in FIG. 17B is used for light irradiation on the strip region 71b which is written at first. FIG. 17C corresponds to FIG. 13C and elements in FIG. 17C are represented by the same reference numerals as in FIG. 13C. In the micromirror group 222 shown in FIG. 17B, micromirrors 226 are also made inactivated in addition to the inactivated micromirrors 225 shown in FIG. 16A, and a mask area 654 is additionally set to the preceding irradiation region group 6a in addition to the mask area 653, as shown in FIG. 17C. The mask area 653 has the same function as that in FIG. 16B, and a cumulative passage time in which the preceding irradiation region group 6a and the following irradiation region group 6b pass the overlapping area 73c between the strip regions irradiated with light by the different head parts 20, is shorter than a passage time of the non-overlapping areas 721, 722 by providing the mask area 654 as indicated by the line 75. A position where the cumulative passage time is shortest is not located in the central portion of the overlapping area 73c but slightly close to the side of the non-overlapping area 722.

As discussed above, the mask area may be provided with reference to the preceding irradiation region group 6a, instead of the following irradiation region group 6b.

Figure 18:
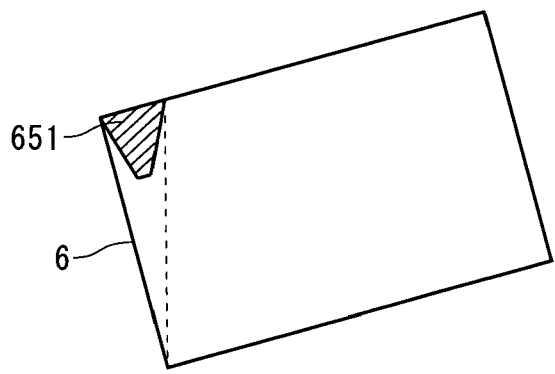
FIG. 18 is a view showing another exemplary mask area.

FIG. 18 is a view showing still another exemplary mask area. A mask area 651 shown in FIG. 18 is used instead of the mask area 651 in FIG. 12B and it is a trapezoid which is formed by deleting a portion close to the apex at the end on the (+Y) direction of the triangular mask area 651 in FIG. 12B. The shape of the mask area 652 in FIG. 13C and the mask areas 653, 654 in FIGS. 16B and 17C may be changed to a trapezoid. As discussed earlier, the inactivated micromirrors can be set in various areas as long as the cumulative passage time in which the preceding irradiation region group 6a and the following irradiation region group 6b pass each position of the overlapping area decreases as it gets away from the borders in the vicinity of the borders between the overlapping area and the non-overlapping areas (more accurately, it monotonically increases from one border to the other border, a regular section is provided as necessary and then, it monotonically decreases). The area of the inactivated micromirrors is determined by repeating the actual writing and confirmation of writing results.

Next discussion will be made on a pattern writing apparatus in accordance with the second preferred embodiment of the present invention. The construction and basic operations of the pattern writing apparatus in accordance with the second preferred embodiment are the same as those of the pattern writing apparatus 1 in accordance with the first preferred embodiment, and the mask data to be used and timing for changing the mask data are only different from those in the first preferred embodiment. In the following discussion, constituent elements are represented by the same reference numerals in the first preferred embodiment.

Figure 19:
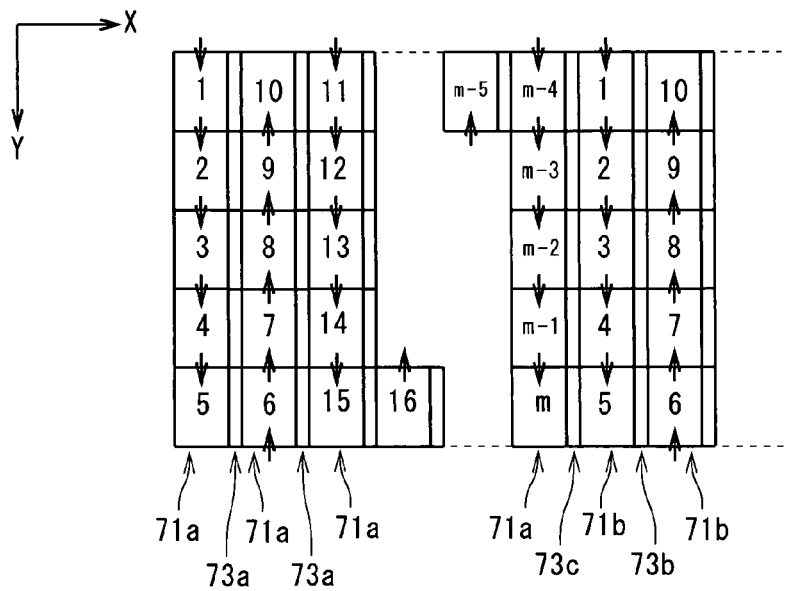
FIG. 19 is a view showing blocks which are the division of the strip regions.

FIG. 19 is a view showing the strip regions 71a, 71b in FIG. 11 which are divided into a plurality of blocks at a regular distance in the main scan direction. In FIG. 19, blocks 1, 2, 3, 4, and 5 which are located at the end on the left side represent the order of the blocks irradiated with light in the first strip region 71a. Blocks 6, 7, 8, 9, and 10 which are located next to the blocks 5 to 1 represent the order of the blocks irradiated with light in the second strip region 71a, and blocks 11, 12, 13, 14, and 15 which are located next to the blocks 10 to 6 represent the order of the blocks irradiated with light in the third strip region 71a.

Out of the blocks 1, 10, blocks 2, 9, . . . , blocks 5, 6 which are arranged in the sub scan direction, the difference (i.e., time interval) of light irradiation time points is largest in the blocks 1, 10 and it is smallest in the blocks 5, 6. Also, the difference of light irradiation time points is smallest in the blocks 10, 11 and it is largest in the blocks 6, 15, out of the blocks 10, 11, blocks 9, 12, . . . , blocks 6, 15. There is a possibility that the above differences of light irradiation time points influence the difference of degrees of photo reaction in the overlapping areas 73a, depending on properties of a photosensitive material. Accordingly, the number of inactivated micromirrors out of the micromirrors corresponding to the overlapping area are changed every block, i.e., the size of mask area is changed in the pattern writing apparatus 1 in accordance with the second preferred embodiment.

Blocks (m−4), (m−3), (m−2), (m−1), and m represent the order of writing in the last strip region 71a. In a case where the number of the strip regions 71a is odd, the differences of the light irradiation time points in the overlapping area 73c between the blocks (m−4), (m−3), (m−2), (m−1), and m of the strip region 71a and the blocks 1, 2, 3, 4, and 5 of the strip region 71b is constant (the above strip regions 71a, 71b are irradiated with light by the different head parts 20). In a case where the number of the strip regions 71a is even, the difference of the light irradiation time points is largest in a pair of blocks located on the (−Y) side and it is smallest in a pair of blocks located on the (+Y) side.

Figure 20:
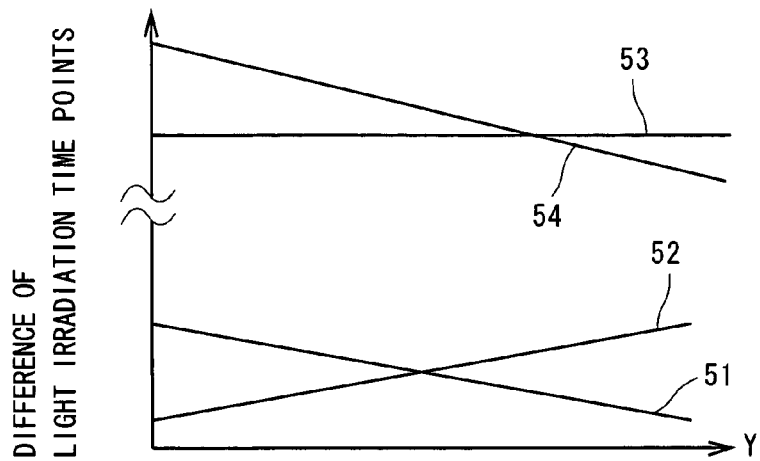
FIG. 20 is a view showing a relationship between the difference of light irradiation time points between adjacent strip regions and a position in the Y direction.
Figure 21A:
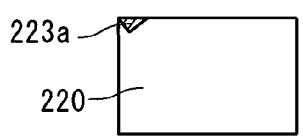
FIGS. 21A to 21E and FIGS. 22A to 22E are views each showing a state of the micromirror group.
Figure 21B:
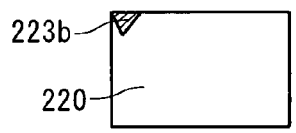
Figure 21C:
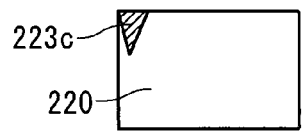
Figure 21D:
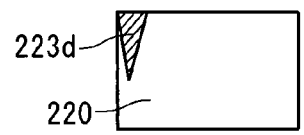
Figure 21E:
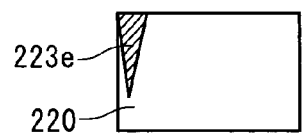
Figure 22A:
Figure 22B:
Figure 22C:
Figure 22D:
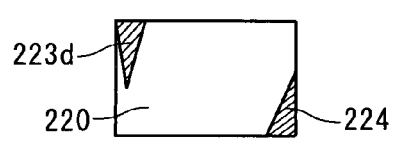
Figure 22E:
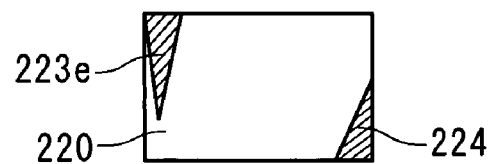

Discussion has been made on the difference of the light irradiation time points between the adjacent strip regions, referring to the blocks. FIG. 20 is a view showing a general relationship between the difference of the light irradiation time points between the adjacent strip regions and a position in the Y direction. The straight line 51 in FIG. 20 indicates the difference of the light irradiation time points between an odd-numbered strip region and the subsequent strip region which are irradiated with light by the same head part 20, and the difference of the light irradiation time points decreases with a larger value of Y coordinates. The straight line 52 indicates the difference of the light irradiation time points between an even-numbered strip region and the subsequent strip region which are irradiated with light by the same head part 20, and the difference of the light irradiation time points increases with a larger value of Y coordinates.

The straight lines 53, 54 indicate the differences of the light irradiation time points between the strip regions which are irradiated with light by the different head parts 20, and these differences of the light irradiation time points are naturally larger than those indicated by the straight lines 51, 52. When light irradiation is performed on odd strip regions by one head part 20, since the two adjacent irradiation regions are irradiated with light in the same direction by the different head parts 20, the difference of the light irradiation time points between the adjacent irradiation regions is constant as indicated by the reference numeral 53. When light irradiation is performed on even strip regions by one head part 20, since the two adjacent irradiation regions are irradiated with light in the opposite direction by the different head parts 20, the difference of the light irradiation time points between the adjacent irradiation regions becomes smaller with a larger value of Y coordinates, as indicated by the reference numeral 54.

FIGS. 21A to 21E and FIGS. 22A to 22E are views showing states of the micromirror groups 222. The inactivated micromirrors are represented by the reference numerals 223a to 223e and 224 and the effective, i.e., activated micromirrors are represented by the reference numeral 220. The heights of the triangular micromirrors in FIGS. 21A to 21E are changed from the micromirror 223 in FIG. 12A, the heights of the triangular micromirrors in FIGS. 22A to 22E are changed from the micromirror 223 in FIG. 13A, and the areas of the micromirrors 224 in FIGS. 22A to 22E are not changed from FIG. 12A.

Figure 23:
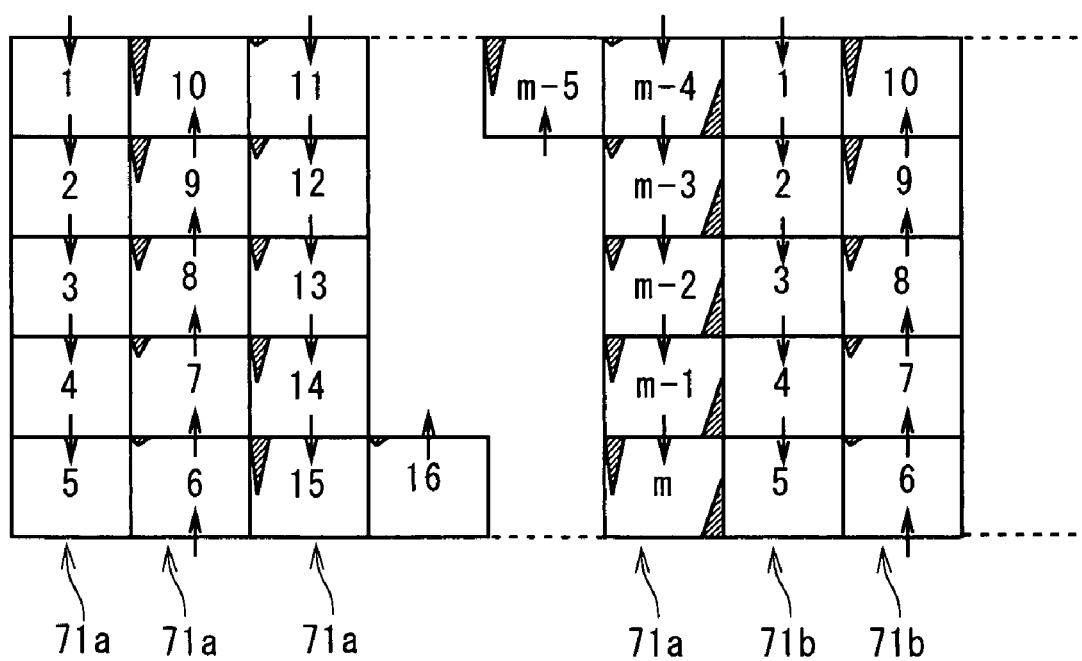
FIG. 23 is a view showing a relationship between the blocks and the mask areas.

FIG. 23 is a view abstractly showing the relationship between the blocks shown in FIG. 19 and the mask areas, and the size of the mask area when light irradiation is performed on each block is shown by hatching. A part of the micromirror group 222 are not made inactivated when light irradiation is performed on the blocks 1 to 5 in the first strip region 71a. When writing is performed on the blocks 6 to 10 in the subsequent strip region 71a, the micromirror group 222 is sequentially changed into the states shown by FIGS. 21A to 21E. That is to say, the number of the inactivated micromirrors gradually increases and the mask area increases on the photosensitive material to reduce the irradiation region group 6. As a result, a cumulative passage time in which the irradiation region group 6 in the forward and backward paths passes each position of the overlapping area between the blocks 5, 6 is made slightly shorter than a passage time where the irradiation region group 6 passes the non-overlapping area, and a cumulative passage time in which the irradiation region group 6 in the forward and backward paths passes each position of the overlapping area between the blocks 1, 10 is made greatly shorter than a passage time where the irradiation region group 6 passes the non-overlapping area.

Consequently, the degree of photo reaction is slightly reduced in each position of the overlapping area between the blocks 5, 6 where the difference of the passage time points of the irradiation region group 6 in the forward and backward paths is small, and the degree of photo reaction is greatly reduced in each position of the overlapping area between the blocks 1, 10 where the difference of the passage time points of the irradiation region group 6 in the forward and backward paths is large, thereby appropriately suppressing unevenness in photo reaction on the whole overlapping area, which is caused by the difference of the passage time points in the forward and backward paths.

Similarly, since the difference of the passage time points of the irradiation region group 6 is small between the blocks 10, 11 and the difference of the passage time points of the irradiation region group 6 is large between the blocks 6, 15, the micromirror group 222 is sequentially changed into the states shown by FIGS. 21A to 21E when light irradiation is performed on the blocks 11 to 15.

When light irradiation is performed on the blocks (m−4), (m−3), (m−2), (m−1), and m in the last strip region 71*a*, the micromirror group 222 is sequentially changed into the states shown by FIGS. 22A to 22E showing the inactivated micromirrors 224, for reducing increase in the degree of photo reaction which is caused by the difference of the passage time points between the blocks (m−4), (m−3), (m−2), (m−1), and m and the blocks 1 to 5 in the strip region 71*b* which is written at first by the different head part 20, similarly to the case of FIG. 13C.

In a case where the number of the strip regions irradiated with light by one head part 20 is odd, the differences of the light irradiation time points between the two strip regions irradiated with light by the different head parts 20 is constant as discussed above, and the size of the inactivated micromirrors 224 is not changed as shown in FIGS. 22A to 22E. On the other hand, in a case where the number of the strip regions 71*a* irradiated with light by one head part 20 is even, the difference of the light irradiation time points between the two strip regions irradiated with light by the different head parts 20 changes to gradually change the area of the micromirrors 224 in FIGS. 22A to 22E, as indicated by the straight line 54 in FIG. 20. As a result, it is possible to more suppress occurrence of unevenness in the overlapping area between the two strip regions irradiated with light by the different head parts 20.

Naturally, as shown in FIG. 16B, there may be a case where a part of the micromirror group 222 are made inactivated in light irradiation on the preceding strip region and the number of the micromirrors which are additionally inactivated is further changed according to a position in the main scan direction. In general, the number of inactivated elements out of light modulator elements corresponding to the overlapping area is changed in the process of writing of at least one of the preceding strip region and the following strip region, to achieve more appropriate pattern writing. In the case of the trapezoid inactivated micromirrors like FIG. 18, the mask data where the height of the trapezoid is changed according to the difference of the light irradiation time points between the blocks is prepared. The number of the blocks which is generated by dividing one strip region is appropriately changed by characteristics of a photosensitive material.

Figure 24:
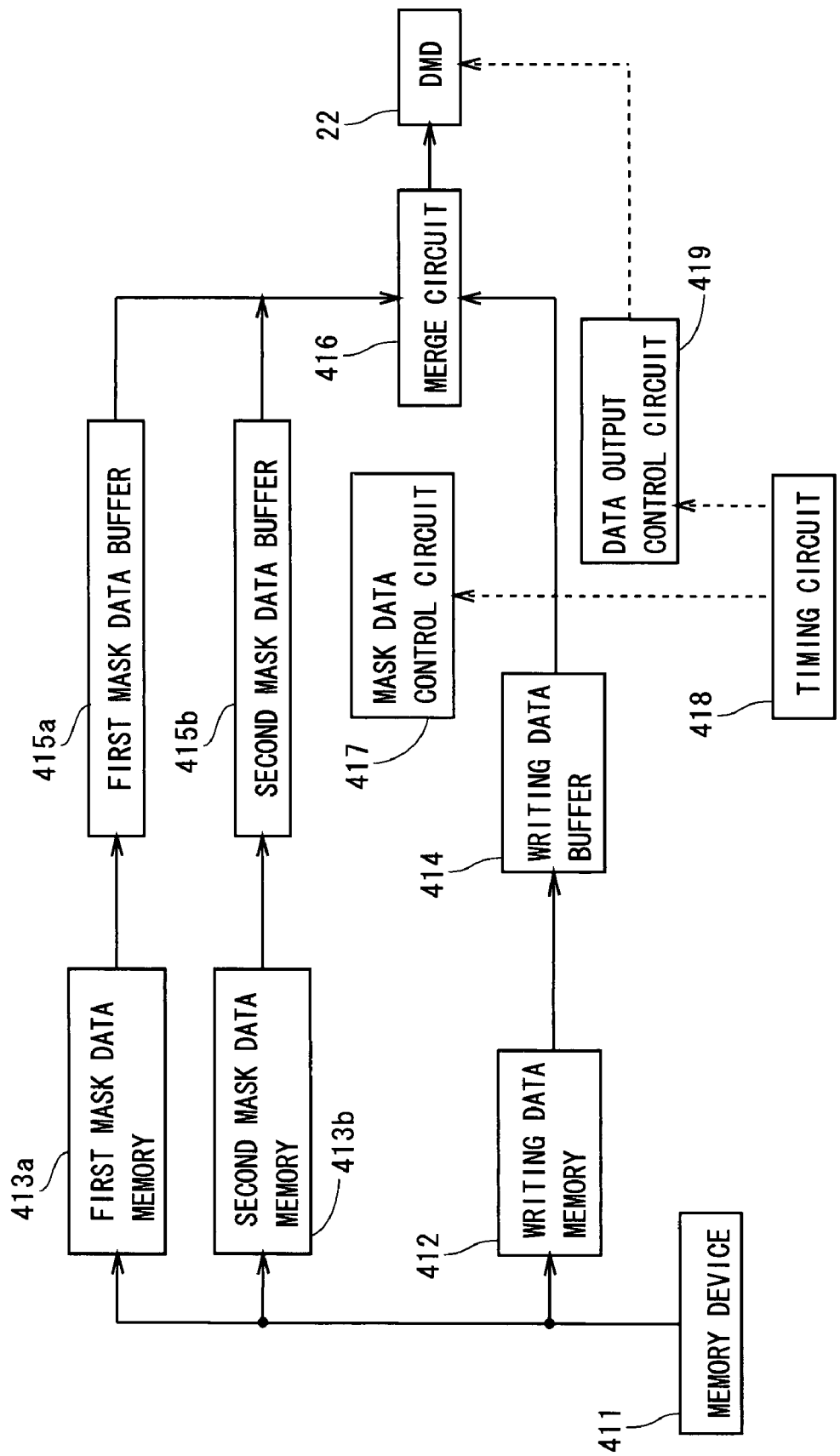
FIG. 24 is a block diagram showing another exemplary constituent elements for controlling the DMD.
Figure 25A:
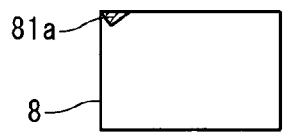
FIGS. 25A to 25 E are views showing strip-to-strip mask data.
Figure 25B:
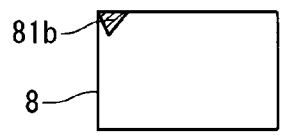
Figure 25C:
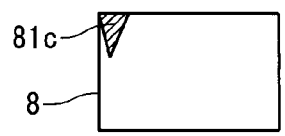
Figure 25D:
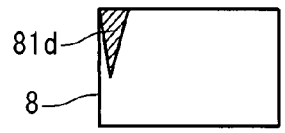
Figure 25E:
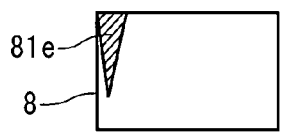

Next discussion will be made on a pattern writing apparatus in accordance with the third preferred embodiment of the present invention. FIG. 24 is a block diagram showing constituent elements for controlling a DMD 22 in the pattern writing apparatus in accordance with the third preferred embodiment and it corresponds to FIG. 14 in the first preferred embodiment. Other constituent elements of the apparatus are the same as those in the first preferred embodiment, and the operations are almost the same as those in the second preferred embodiment.

In FIG. 24, the mask data memory 413 shown in FIG. 14 is replaced with a first mask data memory 413*a* and a second mask data memory 413*b*, and the mask data buffer 415 is replaced with a first mask data buffer 415*a* and a second mask data buffer 415*b*. Mask data outputted from the first mask data buffer 415*a* and the second mask data buffer 415*b* are synthesized with writing data outputted from the writing data buffer 414 in the merge circuit 416. Other constituent elements are the same as those in FIG. 14, and are represented by the same reference numerals.

As discussed above, the mask data represents the area of the inactivated micromirrors and also represents the mask area which lacks a part of the irradiation region group 6 on the photosensitive material. The inactivated micromirrors can be classified into micromirrors corresponding to the overlapping area between the strip regions irradiated with light by the same head part 20 such as the micromirrors 223, 225 shown in FIGS. 12A, 13A, 16A and 17B and the micromirrors 223*a* to 223*e* shown in FIGS. 21A to 21E and 22A to 22E, and micromirrors corresponding to the overlapping area between the adjacent strip regions irradiated with light by the different head parts 20 such as the micromirrors 224, 226 shown in FIGS. 13A, 17B, and 22A to 22E.

Accordingly, the mask data (hereinafter, referred to as "strip-to-strip mask data") indicating the inactivated micromirrors corresponding to the overlapping area between the strip regions written by the same head part 20 and the mask data (hereinafter, referred to as "head-to-head mask data") indicating the inactivated micromirrors corresponding to the overlapping area between the adjacent strip regions written by the different head parts 20 are individually used in the pattern writing apparatus 1 in accordance with the third preferred embodiment.

Figure 26:
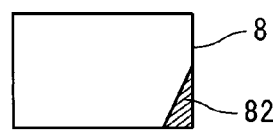
FIG. 26 is a view showing head-to-head mask data.

FIGS. 25A to 25E are visual representation of the strip-to-strip mask data. A rectangular 8 corresponds to the micromirror group 222 in the DMD 22 and areas 81*a* to 81*e* correspond to the inactivated micromirrors. When these strip-to-strip mask data are applied to the DMD 22, the DMD 22 changes to the states shown in FIGS. 21A to 21E. FIG. 26 is a visual representation of the head-to-head mask data, a rectangular 8 corresponds to the micromirror group 222 in the DMD 22 and an area 82 corresponds to the inactivated micromirrors.

When writing with reference to FIG. 23 is performed in the pattern writing apparatus 1 in accordance with the third preferred embodiment, first, light irradiation is performed on the blocks 1 to 5 in a state where data do not exist in the first mask data buffer 415*a* and the second mask data buffer 415*b* or a state where the mask data without the inactivated micromirrors are transmitted from the first mask data memory 413*a* and the second mask data memory 413*b*. In light irradiation of the blocks 6 to 10 in the subsequent strip region 71*a*, the strip-to-strip mask data shown in FIGS. 25A to 25E is sequentially transmitted to the first mask data buffer 415*a* from the first mask data memory 413*a*, and the micromirror group 222 is sequentially changed to the states shown in FIGS. 21A to 21E. As a result, pattern writing is performed while gradually increasing the number of the inactivated micromirrors, to suppress unevenness in the overlapping area. Then, the same operations are repeated while changing the main scan direction of the irradiation region group 6, and light irradiation is performed on the plurality of strip regions 71*a*.

When light irradiation is performed on the last strip region 71*a* out of the plurality of strip regions 71*a*, i.e., light irradiation is performed on the blocks (m−4), (m−3), (m−2), (m−1), and m, the head-to-head mask data shown in FIG. 26 is transmitted from the second mask data memory 413*b* to the second mask data buffer 415*b*, and the strip-to-strip mask data shown in FIGS. 25A to 25E is sequentially transmitted from the first mask data memory 413*a* to the first mask data buffer 415*a*. By synthesizing the two mask data into the writing data, the micromirror group 222 is sequentially changed to the states shown in FIGS. 22A to 22E. Consequently, it is possible to suppress unevenness in the overlapping area between the adjacent strip regions written by the different head parts 20.

As discussed above, since the mask data are classified into the strip-to-strip mask data and the head-to-head mask data, an amount of the mask data can be reduced in the pattern writing apparatus 1 in accordance with the third preferred embodiment.

Though the preferred embodiments of the present invention have been discussed above, the present invention is not limited to the above-discussed preferred embodiments, but allows various variations.

The number of the head part 20 in the pattern writing apparatus 1, e.g., may be three or more, or may be one. The spatial light modulator in the pattern writing apparatus is not limited to the DMD 22 but may be various spatial light modulators such as a multichannel liquid crystal shutter or a plurality of light sources which can flash at high speed. The mechanism for moving the irradiation region group 6 may be a mechanism for moving one of the stage 11 and the light emitting part 2 in the main and sub scan directions. There may be a case where the photosensitive material is held on the side of a drum, main scanning of the irradiation region group is performed by rotating the drum, and sub scanning of the irradiation region group is performed by traveling a plurality of head parts in parallel with a rotation axis.

Figure 27A:
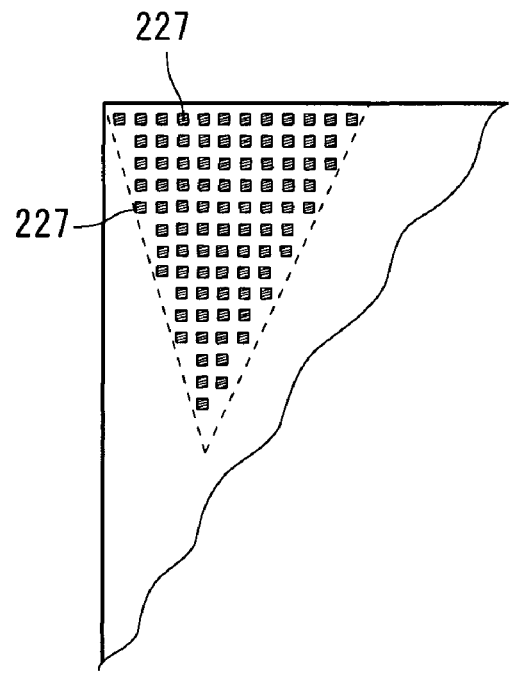
FIG. 27A is a view showing another exemplary state of the micromirror group.
Figure 27B:
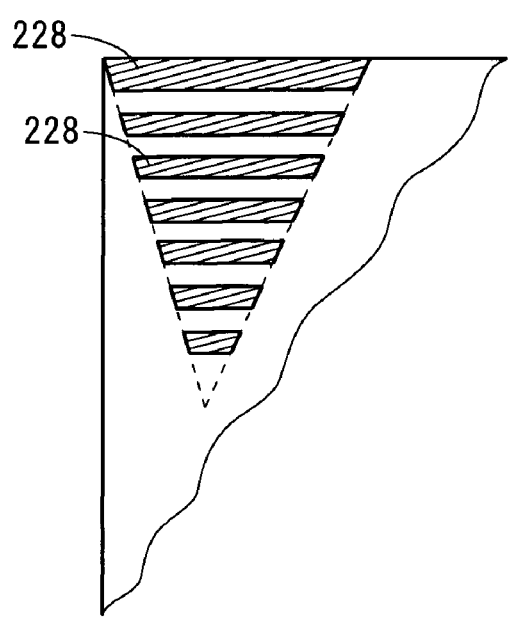
FIG. 27B is a view showing still another exemplary state of the micromirror group.

Though the area of the inactivated micromirrors is a triangular or a trapezoid in the above preferred embodiments, inactivated micromirrors 227 can be scattered as shown in FIG. 27A or inactivated micromirrors 228 can be arranged in a strip pattern as shown in FIG. 27B, as long as the cumulative passage time of the preceding irradiation region group 6a and the following irradiation region group 6b is made shorter in the overlapping area.

Further, the inactivated micromirrors may be set in the micromirror group 222 in both light-emission controls of the preceding irradiation region group 6a and the following irradiation region group 6b. That is to say, a part of micromirrors corresponding to the overlapping area out of the micromirror group 222 in the DMD 22 are made inactivated in writing of at least one of the preceding strip region and the following strip region, to achieve an appropriate writing on the overlapping area.

Though the inactivated micromirrors are only a part of micromirrors corresponding to the overlapping area in the above preferred embodiments, there may be a case where for example, when the sensitivity of the photosensitive material is high, a plurality rows of micromirrors out of the micromirror group 222 are forcefully made inactivated and a part of micromirrors corresponding to the overlapping area are additionally inactivated. Also in this case, the irradiation regions on the photosensitive material corresponding to the micromirrors which are activated in light irradiation on the preceding strip region and the following strip region are the preceding irradiation region group and the following irradiation region group, respectively.

Though the plurality of regions on the photosensitive material corresponding to the micromirror group 222 are arranged in the row and column directions and the column direction is tilted to the main scan direction in the above preferred embodiments, even if the column direction is not tilted to the main scan direction, a part of the micromirror group 222 can be made inactivated. For example, main scanning of the preceding irradiation region group and the following irradiation region group where the arrangement directions are not tilted is performed so that the preceding irradiation region group and the following irradiation region group partially overlap in the sub scan direction, and the lengths in the main scan direction of the preceding irradiation region group and the following irradiation region group contained in the overlapping area are extremely made shorter (for example, the above lengths are made a little less than half of the length in the main scan direction of the non-overlapping area), to make the cumulative passage time in which the preceding irradiation region group and the following irradiation region group pass each position of the overlapping area shorter than the passage time where the irradiation region group passes each position of the non-overlapping area.

In the above preferred embodiments, the width in the sub scan direction of the non-overlapping area is made equal to the length of projection of the side in the row direction of a rectangular region group on the photosensitive material corresponding to the micromirror group 222, onto a straight line extending in the sub scan direction, and the cumulative passage time of a region group corresponding to the micromirror group 222 (the region group is the combination of the irradiation region group 6 and the mask area) can be easily constant in each position of the non-overlapping area and it is therefore possible to easily perform setting of the inactivated micromirrors.

Figure 28:
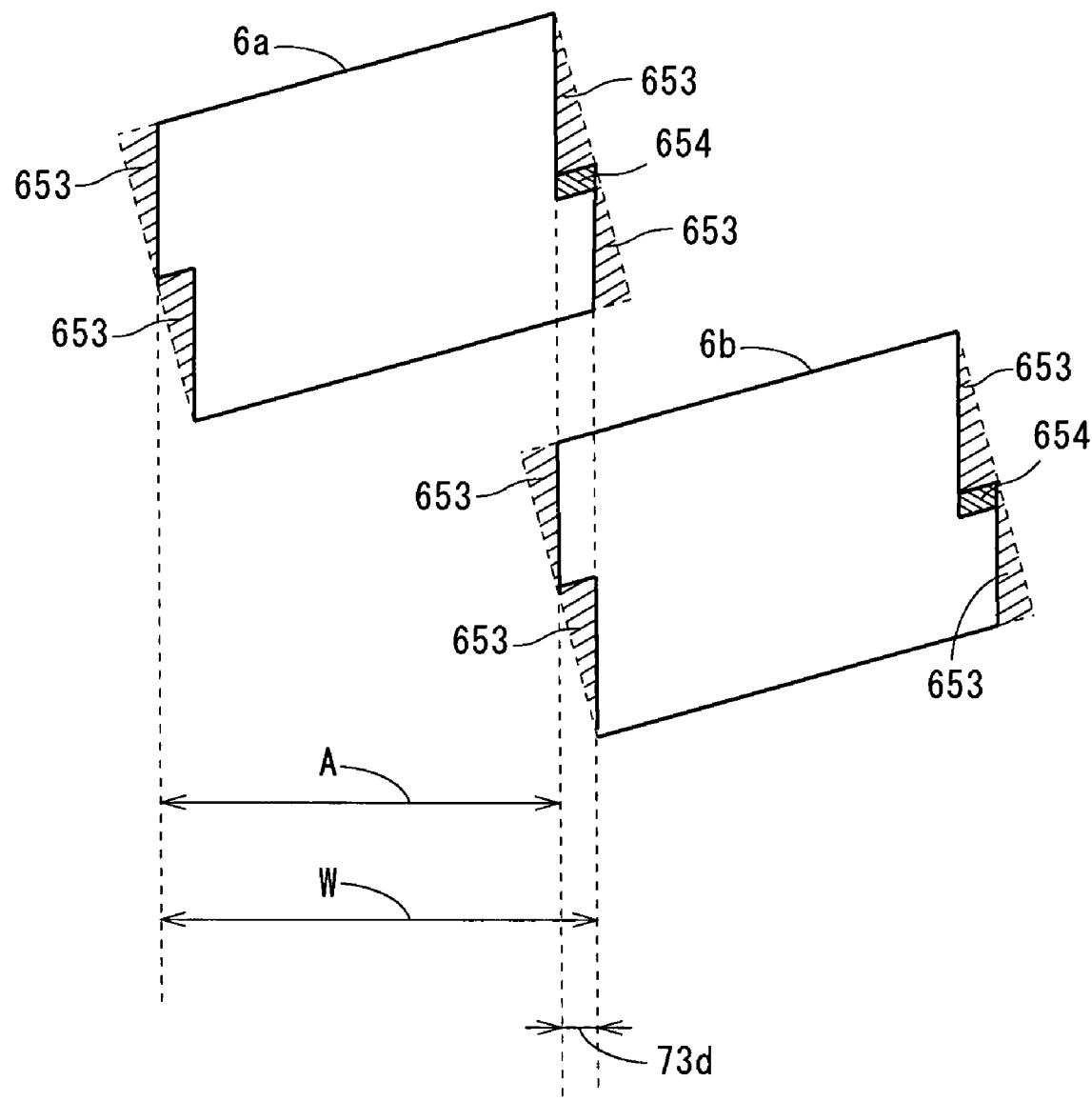
FIG. 28 is a view showing another example of the preceding irradiation region group and the following irradiation region group.

The width of the non-overlapping area (a pitch of the strip regions) may be shorter than the case of the above preferred embodiments in the pattern writing apparatus 1. FIG. 28 is a view showing an example where the pitch of the strip regions is made shorter. In FIG. 28, the reference numeral A indicates the pitch of the strip regions, i.e., an intermittent travel distance of the irradiation region group 6, and the reference numeral W indicates the width of the irradiation region group 6, i.e., the width of the strip region. In a rectangular area corresponding to the micromirror group 222, first mask areas 653 which are four right triangles contacting sides along the column direction of the rectangular area are set, and an area extending in the main scan direction in the range designated by 73d is the overlapping area. A rhombus second mask area 654 overlapping with the overlapping area 73d is set in the preceding irradiation region group 6a. A passage time in which the preceding irradiation region group 6a and the second mask area 654 pass each position of the overlapping area 73d is made half of that in which the preceding irradiation region group 6a passes each position of the non-overlapping area, and also a passage time where the following irradiation region group 6b passes each position of the overlapping area 73d is made half of that in which the following irradiation region group 6b passes each position of the non-overlapping area. As a result, a cumulative passage time in which the preceding irradiation region group 6a and the following irradiation region group 6b pass each position of the overlapping area 73d is made shorter than a passage time where the irradiation region group passes each position of the non-overlapping area, and it is possible to achieve an appropriate writing.

As discussed above, the irradiation region group corresponding to the activated micromirrors may be various forms and the combined area of the irradiation region group and the mask area may not be a rectangle. Naturally, when the micromirror group 222 is arranged in a rectangular area, the length of projection of the side in the row direction of a region group on the photosensitive material corresponding to the micromirror group 222, onto a straight line extending in the sub scan direction, is made to the width of the non-overlapping area, and it is therefore possible to use a lot of micromirrors for writing. Also, more micromirrors can be used for writing by setting the mask area so as to overlap with only the overlapping area.

The photosensitive material is not limited to the photoresist film but may be one which responds to light irradiation, such as a material which responds to heat by light irradiation.

As an object to be written in the pattern writing apparatus 1, various substrates where the photosensitive material is applied can be used, such as a printed circuit board, an original board for a printed circuit board, a semiconductor substrate, a glass substrate for a flat panel display, or a substrate of a metal mask for solder printing. The writing pattern may be an image pattern such as halftone dots and the above technique can be utilized, e.g., when an image pattern is written on a photosensitive material such as silver halide in an image setter.

While the invention has been shown and described in detail, the foregoing description is in all aspects illustrative and not restrictive. It is therefore understood that numerous modifications and variations can be devised without departing from the scope of the invention.

This application claims priority benefit under 35 U.S.C. Section 119 of Japanese Patent Application No. 2006-247619 filed in the Japan Patent Office on Sep. 13, 2006, the entire disclosure of which is incorporated herein by reference.

What is claimed is:

1. A pattern writing apparatus for writing a pattern on a photosensitive material by light irradiation on said photosensitive material, comprising:
    a light emitting part for emitting light to a photosensitive material;
    an irradiation region moving mechanism for moving an irradiation region group on said photosensitive material, said irradiation region group irradiated with light emitted from said light emitting part; and
    a control part for controlling movement of said irradiation region group and light irradiation on respective irradiation regions included in said irradiation region group to perform writing on said photosensitive material by applying light to each position on said photosensitive material while passing a plurality of irradiation regions over said each position, wherein
    light irradiation is performed on a preceding strip region on said photosensitive material by controlling light irradiation on a preceding irradiation region group by said light emitting part and moving said preceding irradiation region group in parallel with a main scan direction, and light irradiation is performed on a following strip region which is adjacent to and partially overlaps with said preceding strip region by controlling light irradiation on a following irradiation region group by said light emitting part and moving said following irradiation region group in parallel with said main scan direction, and
    said preceding irradiation region group or said following irradiation region group continuously passes each position of a non-overlapping area which belongs to said preceding strip region or said following strip region in a constant time, and a cumulative passage time in which said preceding irradiation region group and said following irradiation region group pass each position of an overlapping area between said preceding strip region and said following strip region is shorter than said constant time.

2. The pattern writing apparatus according to claim 1, wherein
    said light emitting part comprises a spatial light modulator for applying light to said preceding irradiation region group and said following irradiation region group in turn.

3. The pattern writing apparatus according to claim 2, wherein
    said spatial light modulator has a two-dimensional array of a plurality of light modulator elements arranged in a rectangular region and a plurality of regions on said photosensitive material corresponding to said plurality of light modulator elements are arranged in a row direction and a column direction which are perpendicular to each other in a rectangular form, and
    said column direction is inclined to said main scan direction.

4. The pattern writing apparatus according to claim 3, wherein
    said plurality of light modulator elements are a plurality of micromirrors, orientations of which are individually changed.

5. The pattern writing apparatus according to claim 3, wherein
    a width in a sub scan direction of said non-overlapping area is equal to a length of projection of a side in said row direction of said rectangular form onto a straight line extending in said sub scan direction.

6. The pattern writing apparatus according to claim 5, wherein
    a part of light modulator elements corresponding to said overlapping area, out of said plurality of light modulator elements in said spatial light modulator, are inactivated in writing of at least one of said preceding strip region and said following strip region,
    irradiation regions on said photosensitive material corresponding to light modulator elements which are activated in writing of said preceding strip region and said following strip region, are said preceding irradiation region group and said following irradiation region group, respectively, and
    a cumulative passage time in which said preceding irradiation region group and said following irradiation region group pass each position of said overlapping area decreases as it gets away from a border between said overlapping area and said non-overlapping area in the vicinity of said border.

7. The pattern writing apparatus according to claim 6, wherein
    the number of elements which are inactivated out of light modulator elements corresponding to said overlapping area is changed in the process of writing of at least one of said preceding strip region and said following strip region.

8. The pattern writing apparatus according to claim 2, wherein
    a part of said plurality of light modulator elements in said spatial light modulator are inactivated in writing of at least one of said preceding strip region and said following strip region, and
    irradiation regions on said photosensitive material corresponding to light modulator elements which are activated in writing of said preceding strip region and said following strip region, are said preceding irradiation region group and said following irradiation region group, respectively.

9. The pattern writing apparatus according to claim 8, wherein
    a part of light modulator elements corresponding to said overlapping area, out of said plurality of light modulator elements, are inactivated and the rest of said plurality of light modulator elements are activated.

10. The pattern writing apparatus according to claim 8, wherein
    the number of elements which are inactivated out of light modulator elements corresponding to said overlapping area is changed in the process of writing of at least one of said preceding strip region and said following strip region.

11. The pattern writing apparatus according to claim 1, wherein said light emitting part comprises two spatial light modulators each of which has the same array of a plurality of light modulator elements and a relative position of said two spatial light modulators is fixed, and said two spatial light modulators perform light irradiation on said preceding irradiation region group and said following irradiation region group, respectively.

12. The pattern writing apparatus according to claim 11, wherein each of said two spatial light modulators has a two-dimensional array of a plurality of light modulator elements arranged in a rectangular region and a plurality of regions on said photosensitive material corresponding to said plurality of light modulator elements are arranged in a row direction and a column direction which are perpendicular to each other in a rectangular form, and said column direction is inclined to said main scan direction.

13. The pattern writing apparatus according to claim 12, wherein said plurality of light modulator elements are a plurality of micromirrors, orientations of which are individually changed.

14. The pattern writing apparatus according to claim 12, wherein a width in a sub scan direction of said non-overlapping area is equal to a length of projection of a side in said row direction of said rectangular form onto a straight line extending in said sub scan direction.

15. The pattern writing apparatus according to claim 14, wherein a part of light modulator elements corresponding to said overlapping area, out of said plurality of light modulator elements in a spatial light modulator which performs writing, are inactivated in writing of at least one of said preceding strip region and said following strip region, irradiation regions on said photosensitive material corresponding to light modulator elements which are activated in writing of said preceding strip region and said following strip region, are said preceding irradiation region group and said following irradiation region group, respectively, and a cumulative passage time in which said preceding irradiation region group and said following irradiation region group pass each position of said overlapping area decreases as it gets away from a border between said overlapping area and said non-overlapping area in the vicinity of said border.

16. The pattern writing apparatus according to claim 15, wherein the number of elements which are inactivated out of light modulator elements corresponding to said overlapping area is changed in the process of writing of at least one of said preceding strip region and said following strip region.

17. The pattern writing apparatus according to claim 11, wherein a part of said plurality of light modulator elements in a spatial light modulator which performs writing are inactivated in writing of at least one of said preceding strip region and said following strip region, and irradiation regions on said photosensitive material corresponding to light modulator elements which are activated in writing of said preceding strip region and said following strip region, are said preceding irradiation region group and said following irradiation region group, respectively.

18. The pattern writing apparatus according to claim 17, wherein a part of light modulator elements corresponding to said overlapping area, out of said plurality of light modulator elements, are inactivated and the rest of said plurality of light modulator elements are activated.

19. The pattern writing apparatus according to claim 17, wherein the number of elements which are inactivated out of light modulator elements corresponding to said overlapping area is changed in the process of writing of at least one of said preceding strip region and said following strip region.

20. A pattern writing method of writing a pattern on a photosensitive material by moving an irradiation region group irradiated with light on said photosensitive material and controlling light irradiation on respective irradiation regions included in said irradiation region group to perform light irradiation on each position on said photosensitive material while a plurality of irradiation regions pass said each position, said method comprising the steps of:

controlling light irradiation on a preceding irradiation region group and moving said preceding irradiation region group in parallel with a main scan direction, to perform light irradiation on a preceding strip region on said photosensitive material, and controlling light irradiation on a following irradiation region group and moving said following irradiation region group in parallel with said main scan direction, to perform light irradiation on a following strip region which is adjacent to and partially overlaps with said preceding strip region, wherein said preceding irradiation region group or said following irradiation region group continuously passes each position of a non-overlapping area which belongs to said preceding strip region or said following strip region in a constant time, and a cumulative passage time in which said preceding irradiation region group and said following irradiation region group pass each position of an overlapping area between said preceding strip region and said following strip region is shorter than said constant time.

21. The pattern writing method according to claim 20, wherein a part of a plurality of light modulator elements in a spatial light modulator which performs writing are inactivated in writing of at least one of said preceding strip region and said following strip region, and irradiation regions on said photosensitive material corresponding to light modulator elements which are activated in writing of said preceding strip region and said following strip region, are said preceding irradiation region group and said following irradiation region group, respectively.

22. The pattern writing method according to claim 21, wherein the number of elements which are inactivated out of light modulator elements corresponding to said overlapping area is changed in the process of writing of at least one of said preceding strip region and said following strip region.

* * * * *